United States Patent
Kashiyama et al.

(10) Patent No.: US 8,477,301 B2
(45) Date of Patent: Jul. 2, 2013

(54) SUBSTRATE PROCESSING APPARATUS, SUBSTRATE PROCESSING SYSTEM AND INSPECTION/PERIPHERY EXPOSURE APPARATUS

(75) Inventors: Masahito Kashiyama, Kyoto (JP); Yukihiko Inagaki, Kyoto (JP); Kazuya Akiyama, Kyoto (JP); Noriaki Yokono, Kyoto (JP); Isao Taniguchi, Kyoto (JP)

(73) Assignee: Sokudo Co., Ltd. (JP)

( * ) Notice: Subject to any disclaimer, the term of this patent is extended or adjusted under 35 U.S.C. 154(b) by 261 days.

(21) Appl. No.: 12/870,402

(22) Filed: Aug. 27, 2010

(65) Prior Publication Data

US 2011/0063588 A1 Mar. 17, 2011

(30) Foreign Application Priority Data

Sep. 15, 2009 (JP) ................. 2009-213093

(51) Int. Cl.
*G01N 21/00* (2006.01)
(52) U.S. Cl.
USPC .......... 356/237.1; 356/237.3; 355/27; 355/30
(58) Field of Classification Search
USPC ....... 356/237.1–237.5, 614–623; 250/559.36, 250/559.41, 559.45; 396/604, 611; 118/52, 118/319; 355/27, 30
See application file for complete search history.

(56) References Cited

U.S. PATENT DOCUMENTS

| | | | |
|---|---|---|---|
| 6,221,787 B1 | 4/2001 | Ogata | |
| 6,431,769 B1 | 8/2002 | Fukuda et al. | |
| 6,672,779 B2 * | 1/2004 | Ueda et al. | 396/604 |
| 7,609,361 B2 * | 10/2009 | Araki | 355/30 |
| 7,773,212 B1 * | 8/2010 | Wolters et al. | 356/237.4 |
| 2002/0037462 A1 | 3/2002 | Ogata et al. | |
| 2002/0053321 A1 | 5/2002 | Tomita et al. | |
| 2002/0168191 A1 | 11/2002 | Fukuda et al. | |
| 2003/0023454 A1 | 1/2003 | Aiuchi et al. | |
| 2003/0133086 A1 * | 7/2003 | Senba et al. | 355/27 |
| 2003/0202178 A1 * | 10/2003 | Tsuji et al. | 356/237.2 |
| 2003/0213431 A1 | 11/2003 | Fukutomi et al. | |
| 2005/0150451 A1 * | 7/2005 | Tanaka et al. | 118/688 |

(Continued)

FOREIGN PATENT DOCUMENTS

| | | |
|---|---|---|
| JP | 61-201107 | 9/1986 |
| JP | 1-214743 | 8/1989 |

(Continued)

OTHER PUBLICATIONS

Office Action (Notice of Refusal) for counterpart Japanese Application No. 2009-213093, dated Apr. 30, 2013.

*Primary Examiner* — Hoa Pham
(74) *Attorney, Agent, or Firm* — Ostrolenk Faber LLP

(57) ABSTRACT

An edge exposure unit includes a projector, a projector holding unit, a substrate rotating unit, an outer edge detecting unit and a surface inspection processing unit. Each component of the projector holding unit operates to move the projector in an X direction and a Y direction. The projector irradiates a peripheral portion of a substrate with light transmitted from a light source for exposure through a light guide. Edge sampling processing is performed based on distribution of an amount of light received in a CCD line sensor of the outer edge detecting unit. Surface inspection processing is performed based on distribution of an amount of light received in a CCD line sensor of the surface inspection processing unit.

10 Claims, 14 Drawing Sheets

U.S. PATENT DOCUMENTS

| | | | |
|---|---|---|---|
| 2005/0271382 A1 | 12/2005 | Ogata et al. | |
| 2008/0014333 A1* | 1/2008 | Matsuoka et al. | 427/8 |
| 2008/0182211 A1 | 7/2008 | Ogata et al. | |
| 2009/0033890 A1* | 2/2009 | Fujiwara et al. | 355/30 |
| 2009/0097041 A1* | 4/2009 | Heiden | 356/616 |
| 2009/0142162 A1 | 6/2009 | Ogura et al. | |
| 2009/0316143 A1* | 12/2009 | Yokota et al. | 356/237.5 |
| 2010/0047702 A1 | 2/2010 | Ogata et al. | |

FOREIGN PATENT DOCUMENTS

| | | |
|---|---|---|
| JP | 7-12747 | 1/1995 |
| JP | 9-171149 | 6/1997 |
| JP | 11-145052 | 5/1999 |
| JP | 2000-5687 | 1/2000 |
| JP | 2002-64048 | 2/2002 |
| JP | 2002-64049 | 2/2002 |
| JP | 2002-110520 | 4/2002 |
| JP | 2002-141273 | 5/2002 |
| JP | 2002-141274 | 5/2002 |
| JP | 2002-190446 | 7/2002 |
| JP | 2003-7605 | 1/2003 |
| JP | 2003-151893 | 5/2003 |
| JP | 2003-324139 | 11/2003 |
| JP | 2003-344037 | 12/2003 |
| JP | 2003-347191 | 12/2003 |
| JP | 2004-253551 | 9/2004 |
| JP | 2004-253552 | 9/2004 |
| JP | 2004-304209 | 10/2004 |
| JP | 2009-135293 | 6/2009 |
| WO | 99/49504 | 9/1999 |

* cited by examiner

F I G. 9
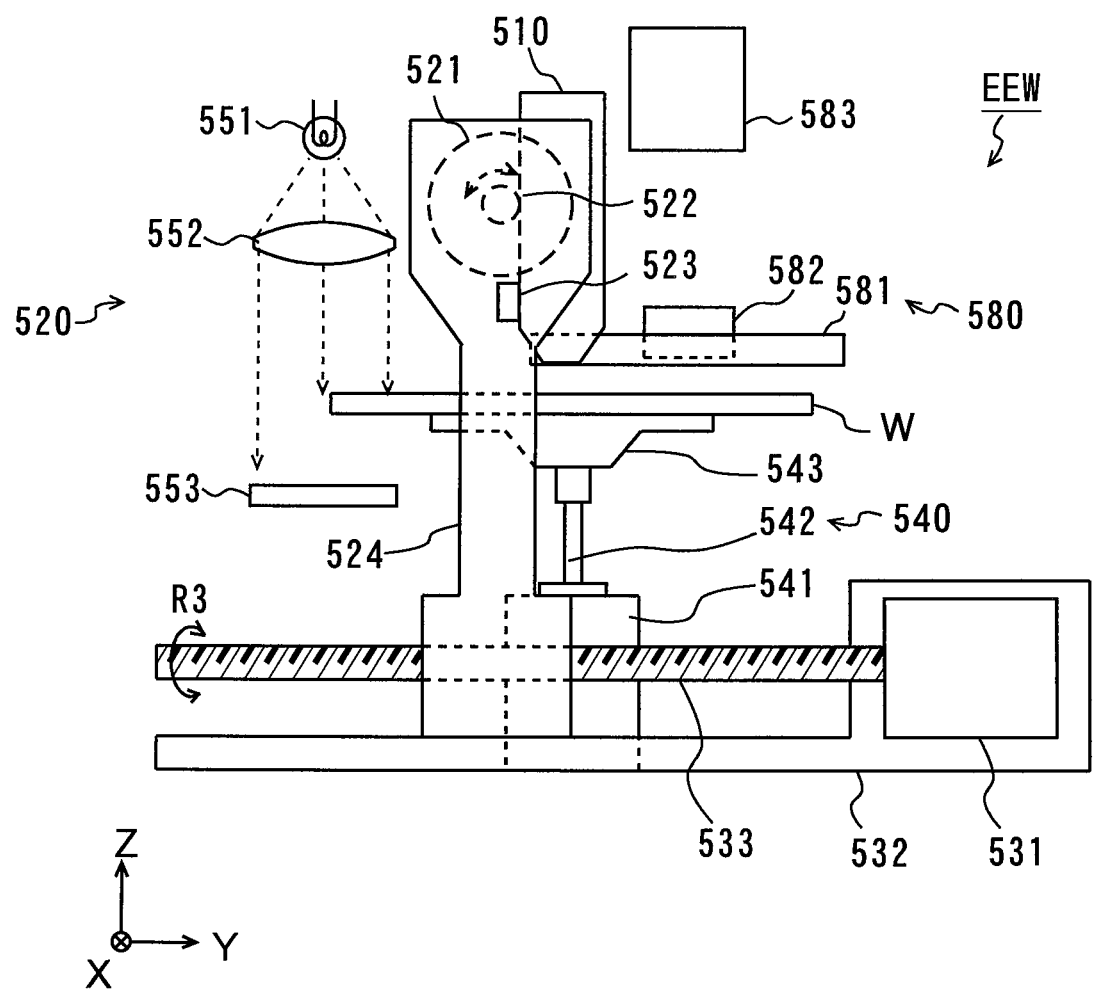

F I G. 1 0
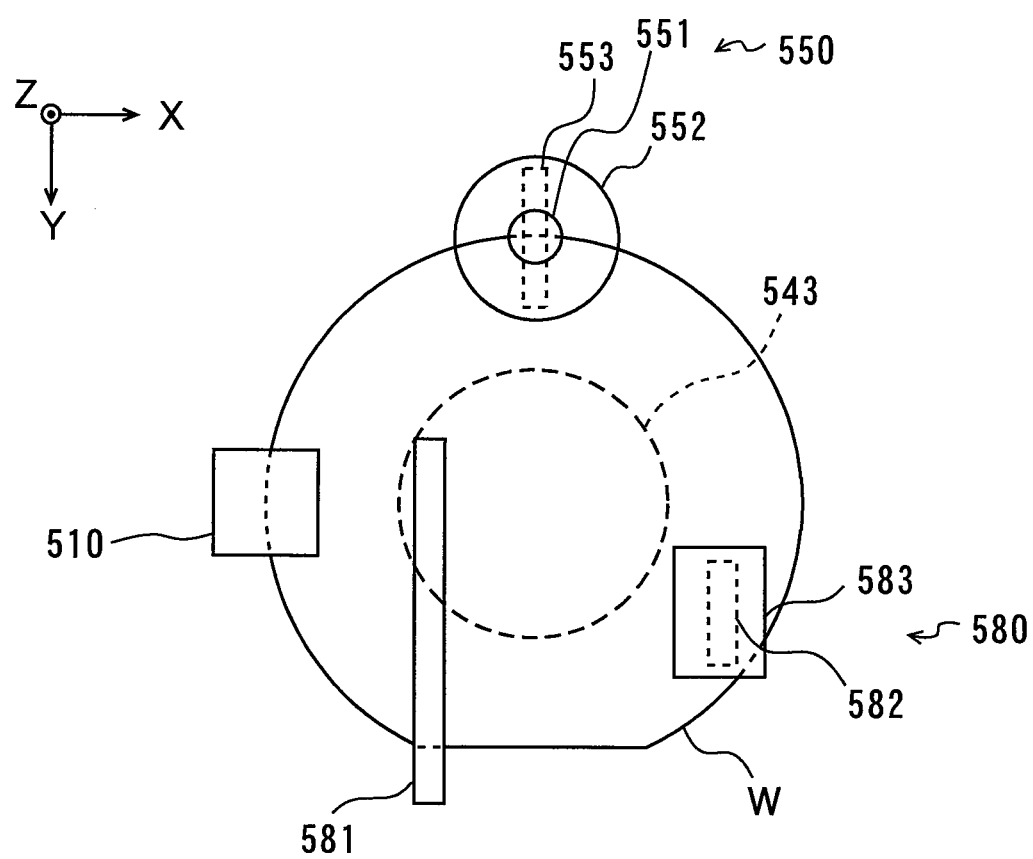

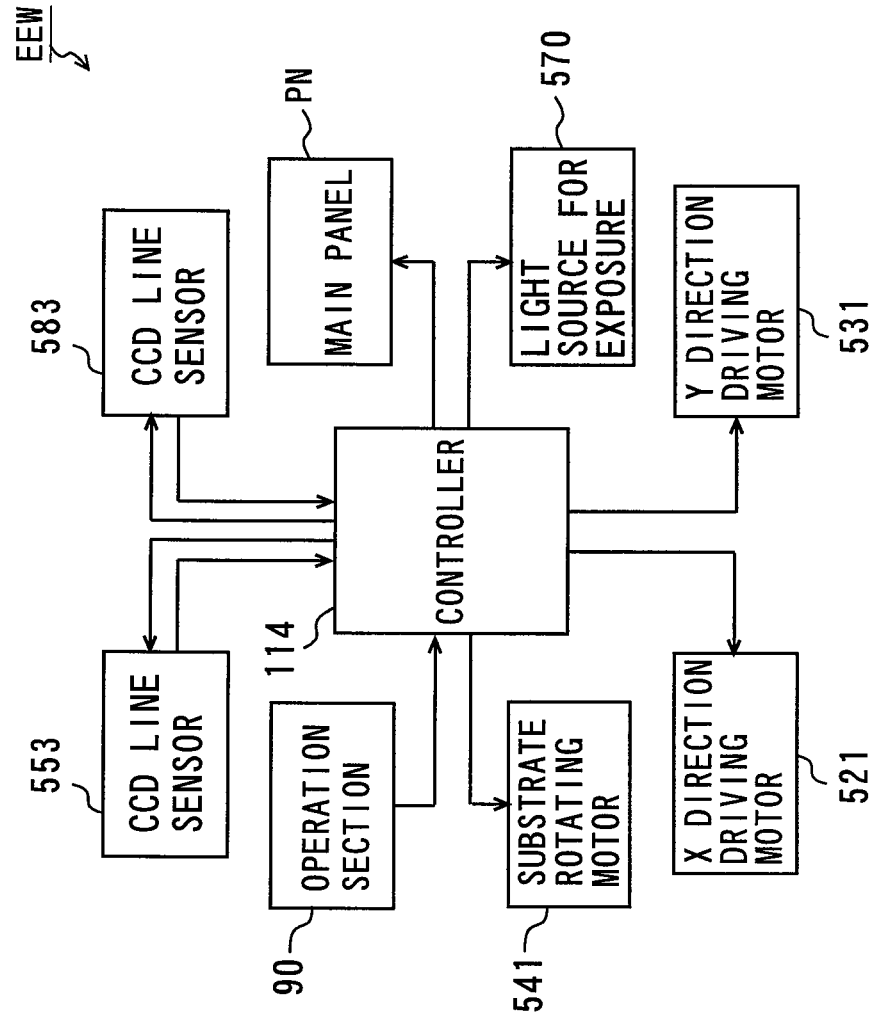
F I G. 11

SUBSTRATE PROCESSING APPARATUS, SUBSTRATE PROCESSING SYSTEM AND INSPECTION/PERIPHERY EXPOSURE APPARATUS

BACKGROUND OF THE INVENTION

1. Field of the Invention

The present invention relates to a substrate processing apparatus, a substrate processing system and an inspection/periphery exposure apparatus.

2. Description of the Background Art

Substrate processing apparatuses are used to subject various substrates such as semiconductor substrates, substrates for liquid crystal displays, plasma displays, optical disks, magnetic disks, magneto-optical disks, photomasks, and other substrates to various types of processing.

For example, the substrate processing apparatus described in JP 2003-324139 A includes a plurality of processing blocks. Each processing block is provided with a plurality of thermal processing sections, a plurality of chemical liquid processing sections and a transport mechanism. Substrates are transported to the thermal processing sections and the chemical liquid processing sections by the transport mechanism in each processing block. The substrates are subjected to given processing in the thermal processing sections and the chemical liquid processing sections.

With recent improvements in density and integration of devices, making finer resist patterns has been an important issue. Conventional exposure devices have generally performed exposure processing by reduction-projecting a reticle pattern on substrates through projection lenses. In such a conventional exposure device, however, the line width of an exposure pattern is determined by the wavelength of a light source of the exposure device, thus limiting the capability to make finer resist patterns.

Therefore, a liquid immersion method is suggested as a projection exposure method allowing for finer exposure patterns (see, e.g., WO99/49504 pamphlet). In a projection exposure device according to the WO99/49504 pamphlet, an area between a projection optical system and a substrate is filled with a liquid, resulting in a shorter wavelength of exposure light on a top surface of the substrate. This allows for finer exposure patterns.

The substrate processing apparatus shown in JP 2003-324139 A subjects the substrates to various types of film formation processing before the exposure processing. In a process of the film formation processing, the surface of a film to be formed on the substrate may be uneven.

The liquid is supplied in the area between the projection optical system and the substrate in the projection exposure device of the WO99/49504 pamphlet. However, the uneven surface of the substrate inhibits the liquid from being held in the area between the projection optical system and the substrate, resulting the liquid flowing to the outside of the substrate in some cases.

The flow of the liquid to the outside of the substrate is liable to cause failures or operational troubles of the exposure device. In addition, the temperature within the exposure device may change. In the case, restoring the exposure device requires much labor and time.

Also in an exposure device not employing the liquid immersion method, the uneven surface of the substrate causes the condition of the substrate after the exposure processing to be different depending on portions, resulting in processing defects of the substrate. Accordingly, complicated operations are required for collecting such a substrate after the processing is finished in the substrate processing apparatus.

BRIEF SUMMARY OF THE INVENTION

An object of the present invention is to provide a substrate processing apparatus, a substrate processing system and an inspection/periphery exposure apparatus capable of preventing malfunctions to be caused by substrates that are not normal in a surface condition.

(1) According to an aspect of the present invention, a substrate processing apparatus that is disposed adjacent to an exposure device that subjects a substrate to exposure processing includes a film formation unit arranged to form a photosensitive film on the substrate before the exposure processing by the exposure device, a development unit arranged to subject the photosensitive film on the substrate to development processing after the exposure processing by the exposure device, an inspection/periphery exposure unit arranged to inspect a surface condition of the substrate and subject a peripheral portion of the photosensitive film on the substrate to exposure processing after the photosensitive film is formed by the film formation unit and before the exposure processing is performed by the exposure device, and a transport device arranged to transport the substrate among the film formation unit, the development unit, the inspection/periphery exposure unit and the exposure device.

In the substrate processing apparatus, the photosensitive film is formed on the substrate by the film formation unit, and inspection of the surface condition of the substrate and the exposure processing of the peripheral portion of the photosensitive film on the substrate are performed by the inspection/periphery exposure unit. After the photosensitive film on the substrate is subjected to the exposure processing in the exposure device, the development unit subjects the photosensitive film on the substrate to the development processing.

In this case, a transport path of the substrate by the transport device can be controlled based on a result of inspection in the inspection/periphery exposure unit. Accordingly, the substrate that is not normal in the surface condition cannot be transported to the exposure device, and only the substrate that is normal in the surface condition can be transported to the exposure device.

This prevents the possibility that when a liquid is supplied onto the substrate in the exposure device, the liquid is not held on the substrate and flows to the outside of the substrate. As a result, failures and operational troubles of the exposure device and change in the temperature within the exposure device to be caused by the outward flow of the liquid can be prevented.

The substrate that is not normal in the surface condition can be distinguished from the substrate that is normal in the surface condition to be collected. Processing defects tend to occur in the substrate that is not normal in the surface condition. Therefore, the collecting operation is easier when such a substrate is distinguished from the substrate that is normal in the surface condition to be collected than when the substrate in which the processing defects have occurred is detected to be collected after the exposure processing.

The inspection of the surface condition of the substrate and the exposure processing of the peripheral portion of the photosensitive film on the substrate are performed in the common inspection/periphery exposure unit, so that an increase in size and manufacturing cost of the substrate processing apparatus is suppressed. Throughput of the substrate processing apparatus can be prevented from decreasing because the number of transport processes of the substrate does not increase.

(2) The substrate processing apparatus may further include a controller arranged to determine whether or not the surface condition of the substrate is normal based on a result of inspection of the surface condition of the substrate in the inspection/periphery exposure unit, and control the transport device to transport the substrate determined to be normal to the exposure device and control the transport device not to transport the substrate determined not to be normal to the exposure device.

In this case, only the substrate determined to be normal in the surface condition is transported to the exposure device by the transport device, thus preventing the possibility that the liquid supplied onto the substrate is not held on the substrate and flows to the outside of the substrate in the exposure device. This prevents failures and operational troubles of the exposure device and change in the temperature within the exposure device to be caused by the outward flow of the liquid.

(3) The substrate processing apparatus may further include a storage arranged to store the substrate determined not to be normal by the controller.

In this case, the substrate determined not to be normal can be made to wait in the storage. Thus, timings of transporting the substrate determined not to be normal can be adjusted.

(4) The substrate processing apparatus may further include a container platform on which a storing container is placed, wherein the controller may be arranged to control the transport device to sequentially take substrates out of the storing container, and control the transport device to cause the substrates that have been subjected to the exposure processing by the exposure device and the development processing by the development unit and the substrates stored in the storage to be stored in the storing container in the same order as that in which the substrates have been taken out from the storing container.

In this case, the substrate that is not normal in the surface condition can be prevented from being transported to the exposure device, and the processing history of the plurality of substrates can be easily managed.

(5) The substrate processing apparatus may further include a processing section, and an interface that is disposed between the processing section and the exposure device and is arranged to carry the substrate in and out of the exposure device, wherein the film formation unit and the development unit may be provided in the processing section, the inspection/periphery exposure unit may be provided in at least one of the processing section and the interface, and the transport device may include a transport mechanism for the processing section arranged to transport the substrate in the processing section, and a transport mechanism for the interface arranged to transport the substrate in the interface.

In this case, the transport mechanism for the processing section and the transport mechanism for the interface can concurrently perform transporting operations of the substrates. This improves the throughput of the substrate processing apparatus.

(6) The processing section may include a first level section and a second level section, the film formation unit may include a first film formation unit provided in the first level section and a second film formation unit provided in the second level section, the development unit may include a first development unit provided in the first level section and a second development unit provided in the second level section, the inspection/periphery exposure unit may include a first inspection/periphery exposure unit provided in the first level section and a second inspection/periphery exposure unit provided in the second level section, the transport mechanism for the processing section may include a first transport mechanism that is provided in the first level section and transports the substrate in the first level section, and a second transport mechanism that is provided in the second level section and transports the substrate in the second level section.

In this case, the processing and transportation of the substrate by the first film formation unit, the first development unit, the first inspection/periphery exposure unit and the first transport mechanism in the first level section can be performed concurrently with the processing and transportation of the substrate by the second film formation unit, the second development unit, the second inspection/periphery exposure unit and the second transport mechanism in the second level section. This further improves the throughput of the substrate processing apparatus.

When the substrate that is not normal in the surface condition is found in one of the first and second inspection/periphery exposure units, the operation of the one of the first and second level sections is stopped and a maintenance operation is performed while the operation of the other can be continued to perform the processing of the substrate.

(7) The controller may be arranged to determine whether or not the surface condition of the substrate is normal based on a result of inspection of the surface condition of the substrate in the first inspection/periphery exposure unit, control the first transport mechanism to transport the substrate determined to be normal to the interface, and control the first transport mechanism not to transport the substrate determined not to be normal to the interface, and determine whether or not the surface condition of the substrate is normal based on a result of inspection of the surface condition of the substrate in the second inspection/periphery exposure unit, control the second transport mechanism to transport the substrate determined to be normal to the interface, and control the second transport mechanism not to transport the substrate determined not to be normal to the interface.

In this case, only the substrate determined to be normal in the surface condition in the first inspection/periphery exposure unit is transported to the interface by the first transport mechanism, and only the substrate determined to be normal in the surface condition in the second inspection/periphery exposure unit is transported to the interface by the second transport mechanism. This causes only the substrates determined to be normal in the surface condition to be transferred to the exposure device through the interface.

This prevents the possibility that when the liquid is supplied onto the substrate in the exposure device, the liquid is not held on the substrate and flows to the outside of the substrate. This prevents failures and operational troubles of the exposure device, and reliably prevents change in the temperature within the exposure device to be caused by the outward flow of the liquid.

The substrate that is not normal in the surface condition can be distinguished from the substrate that is normal in the surface condition to be collected. Therefore, the collecting operation is easier than when the substrate in which the processing defects have occurred is detected to be collected after the exposure processing.

(8) The inspection/periphery exposure unit may include a substrate holding/rotating device arranged to rotate the substrate while holding the substrate, an outer edge detector arranged to detect a position of an outer edge of the substrate rotated by the substrate holding/rotating device, a surface condition detector arranged to detect the surface condition of the substrate rotated by the substrate holding/rotating device, and a light irradiator for exposure arranged to irradiate a peripheral portion of the substrate rotated by the substrate holding/rotating device with light for exposure based on the position of the outer edge detected by the outer edge detector.

In this case, the position of the outer edge of the substrate is detected by the outer edge detector, the surface condition of the substrate is detected by the surface condition detector, and the peripheral portion of the substrate is irradiated with the light for exposure by the light irradiator for exposure while the substrate is rotated by the common substrate holding/rotating device. Accordingly, the surface condition of the substrate can be inspected and the peripheral portion of the photosensitive film on the substrate can be subjected to the exposure processing with a simple configuration.

(9) The surface condition detector may be configured to detect the surface condition of the substrate when the position of the outer edge is detected by the outer edge detector.

In this case, time required for the inspection and processing in the inspection/periphery exposure unit can be reduced. This improves the throughput of the substrate processing apparatus.

(10) According to another aspect of the present invention, a substrate processing system includes one or a plurality of substrate processing apparatuses that are each disposed adjacent to an exposure device that subjects a substrate to exposure processing, and a host computer connected to the one or plurality of substrate processing apparatuses, wherein each substrate processing apparatus includes a film formation unit arranged to form a photosensitive film on the substrate before the exposure processing by the exposure device, a development unit arranged to subject the photosensitive film on the substrate to development processing after the exposure processing by the exposure device, an inspection/periphery exposure unit arranged to inspect a surface condition of the substrate and subject a peripheral portion of the photosensitive film on the substrate to exposure processing after the photosensitive film is formed by the film formation unit and before the exposure processing is performed by the exposure device, and a transport device arranged to transport the substrate among the film formation unit, the development unit, the inspection/periphery exposure unit and the exposure device, and the substrate processing system is configured to transmit a result of inspection in the inspection/periphery exposure unit in each of the one or plurality of substrate processing apparatuses to the host computer.

In each of the substrate processing apparatuses of the substrate processing system, the photosensitive film is formed on the substrate by the film formation unit, and inspection of the surface condition of the substrate and the exposure processing of the peripheral portion of the photosensitive film on the substrate are performed by the inspection/periphery exposure unit. After the exposure device subjects the photosensitive film on the substrate to the exposure processing, the development unit subjects the photosensitive film on the substrate to the development processing.

In this case, a transport path of the substrate by the transport device can be controlled based on the result of inspection in the inspection/periphery exposure unit. Accordingly, the substrate that is not normal in the surface condition is not transported to the exposure device, and only the substrate that is normal in the surface condition can be transported to the exposure device.

This prevents the possibility that when a liquid is supplied onto the substrate in the exposure device, the liquid is not held on the substrate and flows to the outside of the substrate. This prevents failures and operational troubles of the exposure device and change in the temperature within the exposure device to be caused by the outward flow of the liquid.

The substrate that is not normal in the surface condition can be distinguished from the substrate that is normal in the surface condition to be collected. Processing defects tend to occur in the substrate that is not normal in the surface condition. Therefore, the collecting operation is easier when such a substrate is distinguished from the substrate that is normal in the surface condition to be collected than when the substrate in which the processing defects have occurred is detected to be collected after the exposure processing.

The inspection of the surface condition of the substrate and the exposure processing of the peripheral portion of the photosensitive film on the substrate are performed in the common inspection/periphery exposure unit, so that an increase in size and manufacturing cost of the substrate processing apparatus is suppressed. Throughput of the substrate processing apparatus can be prevented from decreasing because the number of transport processes of the substrate does not increase.

The result of inspection in the inspection/periphery exposure unit of each substrate processing apparatus is sent to the host computer. Accordingly, a user can easily confirm the result of inspection in the inspection/periphery exposure unit of each substrate processing apparatus, and the result of inspection in each substrate processing apparatus can be intensively managed.

(11) According to still another aspect of the present invention, an inspection/periphery exposure apparatus includes a substrate holding/rotating device arranged to rotate a substrate while holding the substrate, an outer edge detector arranged to detect a position of an outer edge of the substrate rotated by the substrate holding/rotating device, a surface condition detector arranged to detect a surface condition of the substrate rotated by the substrate holding/rotating device, and a light irradiator for exposure arranged to irradiate a peripheral portion of the substrate rotated by the substrate holding/rotating device with light for exposure based on the position of the outer edge detected by the outer edge detector.

In the inspection/periphery exposure apparatus, the substrate is held and rotated by the substrate holding/rotating device. In the state, the position of the substrate is detected by the outer edge detector, and the surface condition of the substrate is detected by the surface condition detector. The peripheral portion of the substrate is irradiated with the light for exposure by the light irradiator for exposure based on the position of the outer edge detected by the outer edge detector.

When the inspection/periphery exposure apparatus is used before the exposure processing by the exposure device, the substrate that is not normal in the surface condition is not transported to the exposure device, and only the substrate that is normal in the surface condition can be transported to the exposure device based on a result of inspection of the surface condition.

This prevents the possibility that when a liquid is supplied onto the substrate in the exposure device, the liquid is not held on the substrate and flows to the outside of the substrate. As a result, failures and operational troubles of the exposure device and change in the temperature within the exposure device to be caused by the outward flow of the liquid can be prevented.

The substrate that is not normal in the surface condition can be distinguished from the substrate that is normal in the surface condition to be collected. Processing defects tend to occur in the substrate that is not normal in the surface condition. Therefore, the collecting operation is easier when such a substrate is distinguished from the substrate that is normal in the surface condition to be collected than when the substrate in which the processing defects have occurred is detected to be collected after the exposure processing.

The inspection of the surface condition of the substrate and the exposure processing of the peripheral portion of the photosensitive film on the substrate can be performed in the common inspection/periphery exposure apparatus, so that the processing cost and space for installation of the inspection/periphery exposure apparatus are prevented from increasing as compared with a case where each processing is performed in separate devices.

The position of the outer edge of the substrate is detected by the outer edge detector, the surface condition of the substrate is detected by the surface condition detector, and the peripheral portion of the substrate is irradiated with the light for exposure by the light irradiator for exposure while the substrate is rotated by the common substrate holding/rotating device. Accordingly, the surface condition of the substrate can be inspected and the peripheral portion of the photosensitive film on the substrate can be subjected to the exposure processing with a simple configuration.

(12) The surface condition detector may be configured to detect the surface condition of the substrate when the position of the outer edge is detected by the outer edge detector.

In this case, time required for the inspection and processing of the substrate in the inspection/periphery exposure unit can be reduced.

According to the present invention, the possibility that the liquid supplied onto the substrate is not held on the substrate and flows to the outside of the substrate in the exposure device can be prevented. As a result, failures and operational troubles of the exposure device and change in the temperature within the exposure device to be caused by the outward flow of the liquid can be prevented.

The substrate that is not normal in the surface condition can be distinguished from the substrate that is normal in the surface condition to be collected. Therefore, the collecting operation is easier than when the substrate in which the processing defects have occurred is detected to be collected after the exposure processing.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIG. 9 is a diagram schematically showing another side of the edge exposure unit.

FIG. 10 is a schematic plan view of the edge exposure unit.

FIG. 11 is a block diagram showing a relationship between each component of the edge exposure unit and a controller.

DETAILED DESCRIPTION OF THE INVENTION

A substrate processing apparatus, a substrate processing system and an inspection/periphery exposure apparatus according to embodiments of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

(1) Configuration of Substrate Processing System

Figure 1:
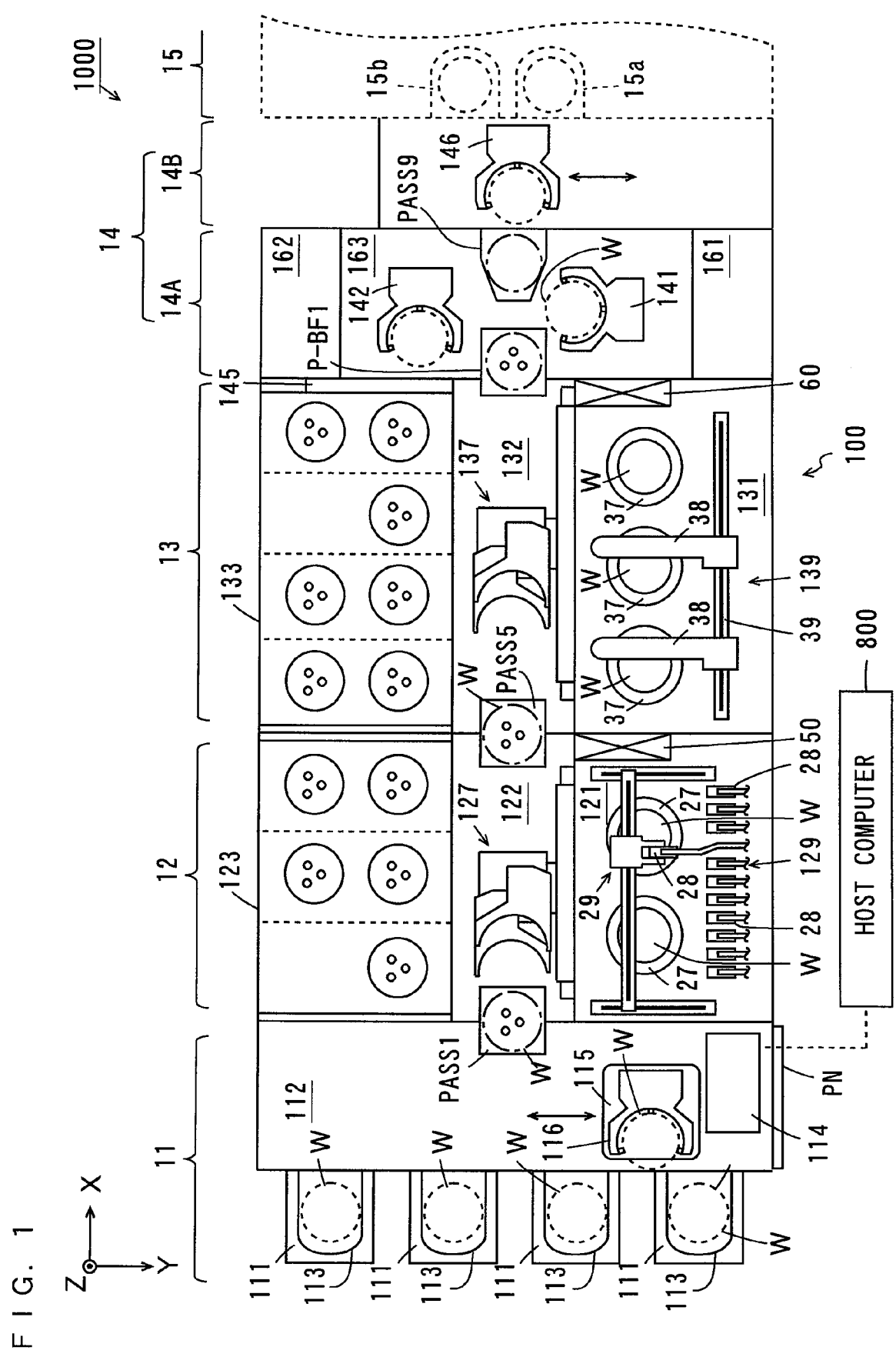
FIG. 1 is a schematic plan view of a substrate processing system according to one embodiment of the present invention.

FIG. 1 is a schematic plan view of a substrate processing system according to one embodiment of the present invention.

Figure 2:
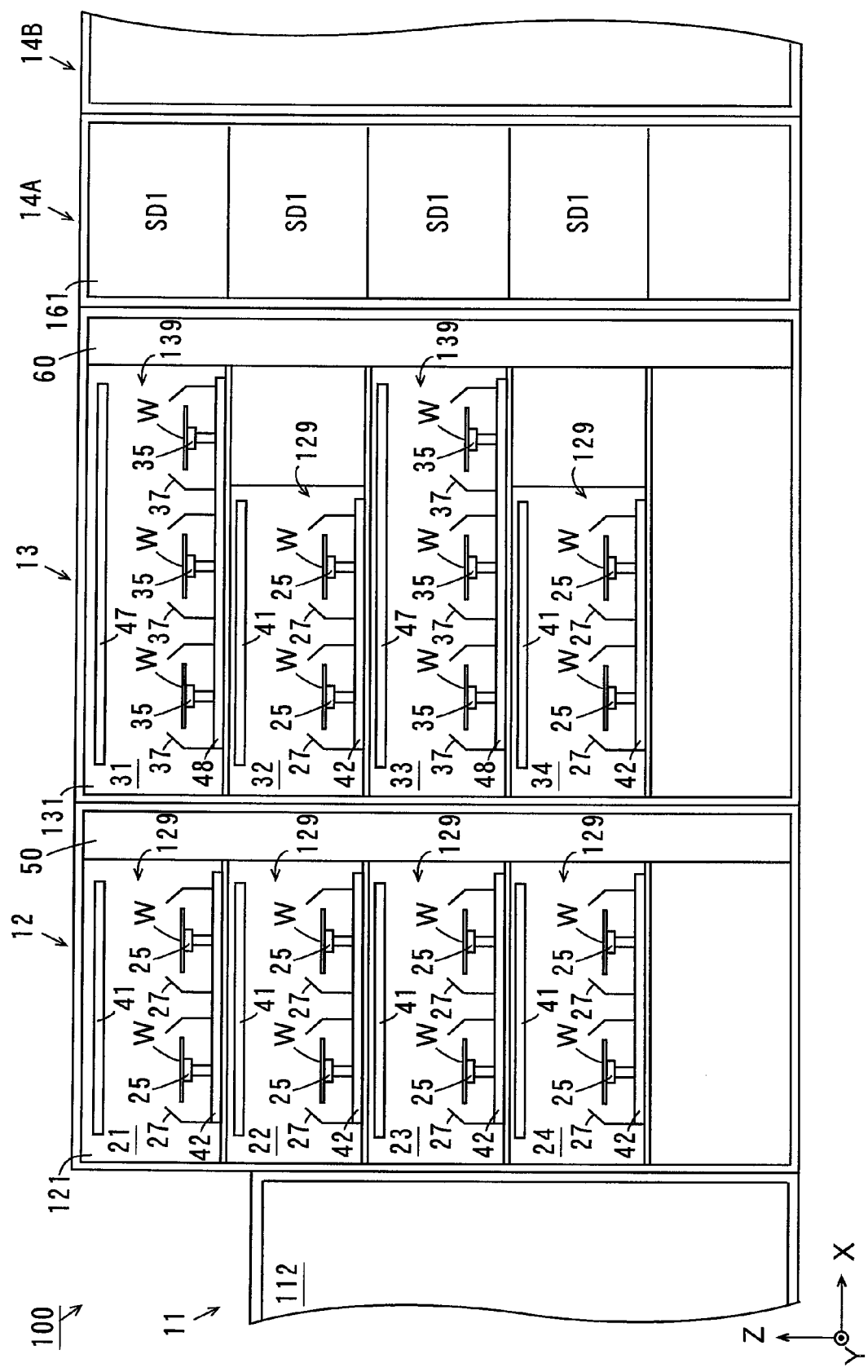
FIG. 2 is a diagram of a coating processing section, a coating/development processing section and a cleaning/drying processing section of FIG. 1 that are seen from the side in a +Y direction.

FIGS. 1, 2 and subsequent given drawings are accompanied by arrows that indicate X, Y, and Z directions, respectively, perpendicular to one another for clarity of a positional relationship. The X and Y directions are perpendicular to each other within a horizontal plane, and the Z direction corresponds to the vertical direction. In each of the directions, the direction of the arrow is defined as a + direction, and the opposite direction is defined as a − direction.

As shown in FIG. 1, the substrate processing system 1000 includes a substrate processing apparatus 100 and a host computer 800.

The substrate processing apparatus 100 includes an indexer block 11, a first processing block 12, a second processing block 13, a cleaning/drying processing block 14A and a carry-in/carry-out block 14B. The cleaning/drying processing block 14A and the carry-in/carry-out block 14B constitute an interface block 14. An exposure device 15 is disposed adjacent to the carry-in/carry-out block 14B. The exposure device 15 subjects a substrate W to exposure processing by means of a liquid immersion method.

As shown in FIG. 1, the indexer block 11 includes a plurality of carrier platforms 111 and a transport section 112. A carrier 113 that stores a plurality of substrates W in multiple stages is placed in each carrier platform 111. Although FOUPs (Front Opening Unified Pods) are adopted as the carriers 113 in the present embodiment, the present invention is not limited to the same. For example, SMIF (Standard Mechanical Inter Face) pods, OCs (Open Cassettes) that expose the stored substrates W to outside air, or the like may be used.

A controller 114 and a transport mechanism 115 are provided in the transport section 112. The controller 114 controls various components of the substrate processing apparatus 100. The controller 114 is connected to the host computer 800 through wire or wireless communication. Various types of data are transmitted/received between the controller 114 and the host computer 800.

Figure 5:
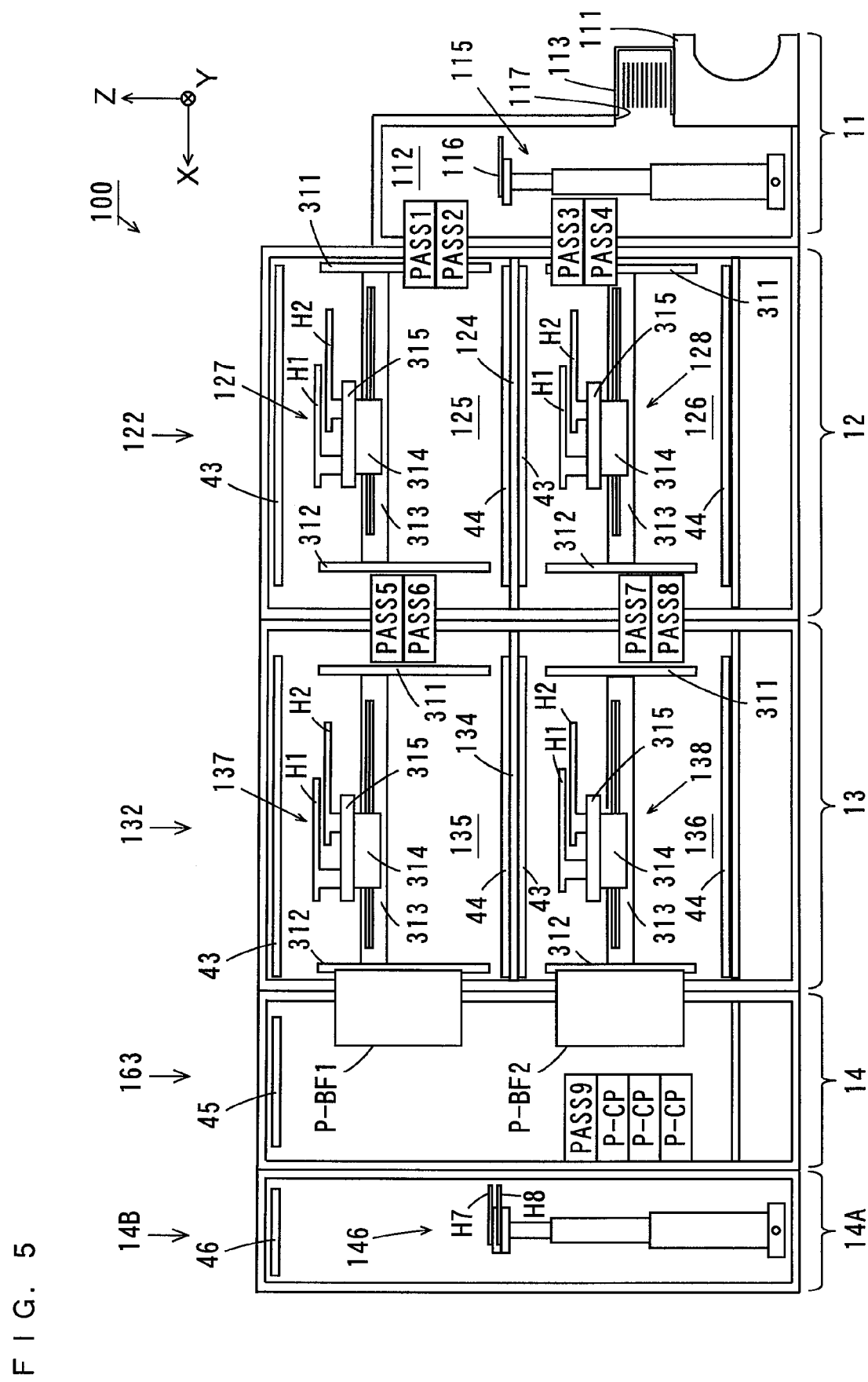
FIG. 5 is a diagram of the transport sections that are seen from the side in the −Y direction.

The transport mechanism 115 is provided with a hand 116 for holding the substrate W. The transport mechanism 115 transports the substrate W while holding the substrate W with the hand 116. An opening 117 through which the substrate W is received and transferred between the carrier 113 and the transport mechanism 115 is formed in the transport section 112 as shown in FIG. 5, described below.

A main panel PN is provided on a side surface of the transport section 112. The main panel PN is connected to the controller 114. A user can confirm the processing status of the substrate W in the substrate processing apparatus 100 and other information on the panel PN.

An operation unit (see FIG. 11, described below) composed of a keyboard, for example, is provided near the main panel PN. The user can make operation settings of the substrate processing apparatus 100, for example, by operating the operation unit.

The first processing block 12 includes a coating processing section 121, a transport section 122 and a thermal processing section 123. The coating processing section 121 and the thermal processing section 123 are provided to be opposite to each other with the transport section 122 therebetween. A substrate platform PASS1 and substrate platforms PASS2 to PASS4 (see FIG. 5), described below, on which the substrates W are to be placed, are provided between the transport section 122 and the indexer block 11. A transport mechanism 127 that transports the substrates W and a transport mechanism 128 (see FIG. 5), described below, are provided in the transport section 122.

The second processing block 13 includes a coating/development processing section 131, a transport section 132 and a thermal processing section 133. The coating/development processing section 131 and the thermal processing section 133 are provided to be opposite to each other with the transport section 132 therebetween. A substrate platform PASS5 and substrate platforms PASS6 to PASS8 (see FIG. 5), described below, on which the substrates W are to be placed are provided between the transport section 132 and the transport section 122. A transport mechanism 137 and a transport mechanism 138 (see FIG. 5), described below, that transport the substrates W are provided in the transport section 132. In the second processing block 13, a gasket 145 is provided between the thermal processing section 133 and the interface block 14.

The cleaning/drying processing block 14A includes cleaning/drying processing sections 161, 162 and a transport section 163. The cleaning/drying processing sections 161, 162 are provided to be opposite to each other with the transport section 163 therebetween. Transport mechanisms 141, 142 are provided in the transport section 163.

A placement/buffer section P-BF1 and a placement/buffer section P-BF2 (see FIG. 5), described below, are provided between the transport section 163 and the transport section 132. The placement/buffer sections P-BF1, P-BF2 are configured to store the plurality of substrates W.

A substrate platform PASS9 and cooling platforms P-CP (see FIG. 5) that are described below are provided between the transport mechanisms 141, 142 so as to be adjacent to the carry-in/carry-out block 14B. The cooling platforms P-CP each have a function of cooling the substrate W (a cooling plate, for example). The substrates W are cooled to a temperature suitable for the exposure processing in the cooling platforms P-CP.

A transport mechanism 146 is provided in the carry-in/carry-out block 14B. The transport mechanism 146 carries the substrates W in and out of the exposure device 15. A substrate carry-in section 15a for carrying the substrate W in and a substrate carry-out section 15b for carrying the substrate W out are provided in the exposure device 15. The substrate carry-in section 15a and the substrate carry-out section 15b of the exposure device 15 may be disposed adjacent to each other in a horizontal direction or may be disposed one above the other.

Here, the carry-in/carry-out block 14B is provided to be movable in the +Y direction and the −Y direction with respect to the cleaning/drying processing block 14A. The carry-in/carry-out block 14B can be moved in the +Y direction or the −Y direction to ensure a working space for maintenance operation of the cleaning/drying processing block 14A, the carry-in/carry-out block 14B and the exposure device 15. Note that the carry-in/carry-out block 14B can be easily moved because of its lighter weight than the other blocks.

A significant amount of liquid (a cleaning liquid and a rinse liquid, for example) is used in the cleaning/drying processing sections 161, 162 in the cleaning/drying processing bock 14A. Therefore, the cleaning/drying processing block 14A needs to be reliably connected to equipment for supplying the liquid. Meanwhile, a liquid is hardly used in the carry-in/carry-out block 14B. Therefore, the carry-in/carry-out block 14B can be connected to the equipment in a simplified manner. That is, the carry-in/carry-out block 14B can be easily separated from and reconnected to the equipment.

Accordingly, only the carry-in/carry-out block 14B is moved while the cleaning/drying processing block 14A is not moved at the time of the maintenance operation of the cleaning/drying processing block 14A, the carry-in/carry-out block 14B and the exposure device 15, thus significantly reducing the labor of workers and working time.

(2) Configurations of the Coating Processing Section and the Development Processing Section FIG. 2 is a diagram of the coating processing section 121, the coating/development processing section 131 and the cleaning/drying processing section 161 of FIG. 1 that are seen from the side in the +Y direction.

As shown in FIG. 2, coating processing chambers 21, 22, 23, 24 are hierarchically provided in the coating processing section 121. A coating processing unit 129 is provided in each of the coating processing chambers 21 to 24. Development processing chambers 31, 33 and coating processing chambers 32, 34 are hierarchically provided in the coating/development processing section 131. A development processing unit 139 is provided in each of the development processing chambers 31, 33, and a coating processing unit 129 is provided in each of the coating processing chambers 32, 34.

Each coating processing unit 129 includes spin chucks 25 that hold the substrates W and cups 27 provided to cover the periphery of the spin chucks 25. In the present embodiment, each coating processing unit 129 is provided with two spin chucks 25 and two cups 27. The spin chucks 25 are rotated by a driving device (an electric motor, for example) that is not shown.

Each coating processing unit 129 includes a plurality of nozzles 28 that discharge a processing liquid and a nozzle transport mechanism 29 that transports the nozzles 28 as shown in FIG. 1.

In the coating processing unit 129, any one of the plurality of nozzles 28 is moved above the substrate W by the nozzle transport mechanism 29. The processing liquid is then discharged from the nozzle 28 to be applied onto the substrate W. The spin chuck 25 is rotated by the driving device, not shown, when the processing liquid is supplied from the nozzle 28 onto the substrate W, thus causing the substrate W to be rotated.

In the present embodiment, a processing liquid for an antireflection film is supplied from the nozzles 28 onto the substrates W in the coating processing units 129 of the coating processing chambers 22, 24. A processing liquid for a resist film is supplied from the nozzles 28 onto the substrates W in the coating processing units 129 of the coating processing chambers 21, 23. A processing liquid for a resist cover film is supplied from the nozzles 28 onto the substrates W in the coating processing units 129 of the coating processing chambers 32, 34.

Similarly to the coating processing unit 129, each development processing unit 139 includes spin chucks 35 and cups 37 as shown in FIG. 2. Each development processing unit 139 includes two slit nozzles 38 that discharge a development liquid and a moving mechanism 39 that moves the slit nozzles 38 in the X direction as shown in FIG. 1.

In the development processing unit 139, first, one slit nozzle 38 supplies the development liquid onto each substrate W while moving in the X direction. Then, the other slit nozzle 38 supplies the development liquid onto each substrate W while moving. The spin chucks 35 are rotated by the driving device, not shown, when the development liquid is supplied from the slit nozzles 38 onto the substrates W, thus causing the substrates W to be rotated.

In the present embodiment, the development liquid is supplied onto the substrates W, so that the resist cover films on the substrates W are removed and the development processing is performed to the substrates W in the development processing unit 139. Different kinds of development liquids are discharged from the two slit nozzles 38 in the present embodiment. Accordingly, the two kinds of development liquids can be supplied onto each substrate W.

While the coating processing unit 129 includes the two cups 27 and the development processing unit 139 includes the three cups 37 in the example of FIG. 2, the coating processing unit 129 may include three cups 27 and the development processing unit 139 may include two cups 37.

A plurality of (four in this example) cleaning/drying processing units SD1 are provided in the cleaning/drying processing section 161. The substrates W before the exposure processing are subjected to cleaning processing and drying processing in the cleaning/drying processing units SD1.

Polishing processing may be performed to a back surface of the substrate W and an end (a bevel portion) of the substrate W using a brush or the like in each cleaning/drying processing unit SD1. Here, the back surface of the substrate W refers to an opposite side of the surface of the substrate W on which various patterns such as a circuit pattern are to be formed.

As shown in FIG. 2, air supply units 41 for supplying clean air whose temperature and humidity are adjusted into the coating processing chambers 21 to 24, 32, 34 are provided above the coating processing units 129 in the coating processing chambers 21 to 24, 32, 34. Air supply units 47 for supplying clean air whose temperature and humidity are adjusted into the development processing chambers 31, 33 are provided above the development processing units 139 in the development processing chambers 31, 33.

An exhaust unit 42 for exhausting an atmosphere within the cup 27 is provided below the coating processing unit 129 in each of the coating processing chambers 21 to 24, 32, 34. An exhaust unit 48 for exhausting an atmosphere within the cup 37 is provided below the development processing unit 139 in each of the development processing chambers 31, 33.

As shown in FIGS. 1 and 2, a fluid box 50 is provided in the coating processing section 121 so as to be adjacent to the coating/development processing section 131. Similarly, a fluid box 60 is provided in the coating/development processing section 131 so as to be adjacent to the cleaning/drying processing block 14A. The fluid box 50 and the fluid box 60 each house fluid related elements such as a pipe, a joint, a valve, a flowmeter, a regulator, a pump, a temperature adjuster used to supply a chemical liquid to the coating processing units 129 or the development processing units 139 and discharge the chemical liquid and air out of the coating processing units 129 or the development processing units 139.

(3) Configurations of the Thermal Processing Sections

Figure 3:
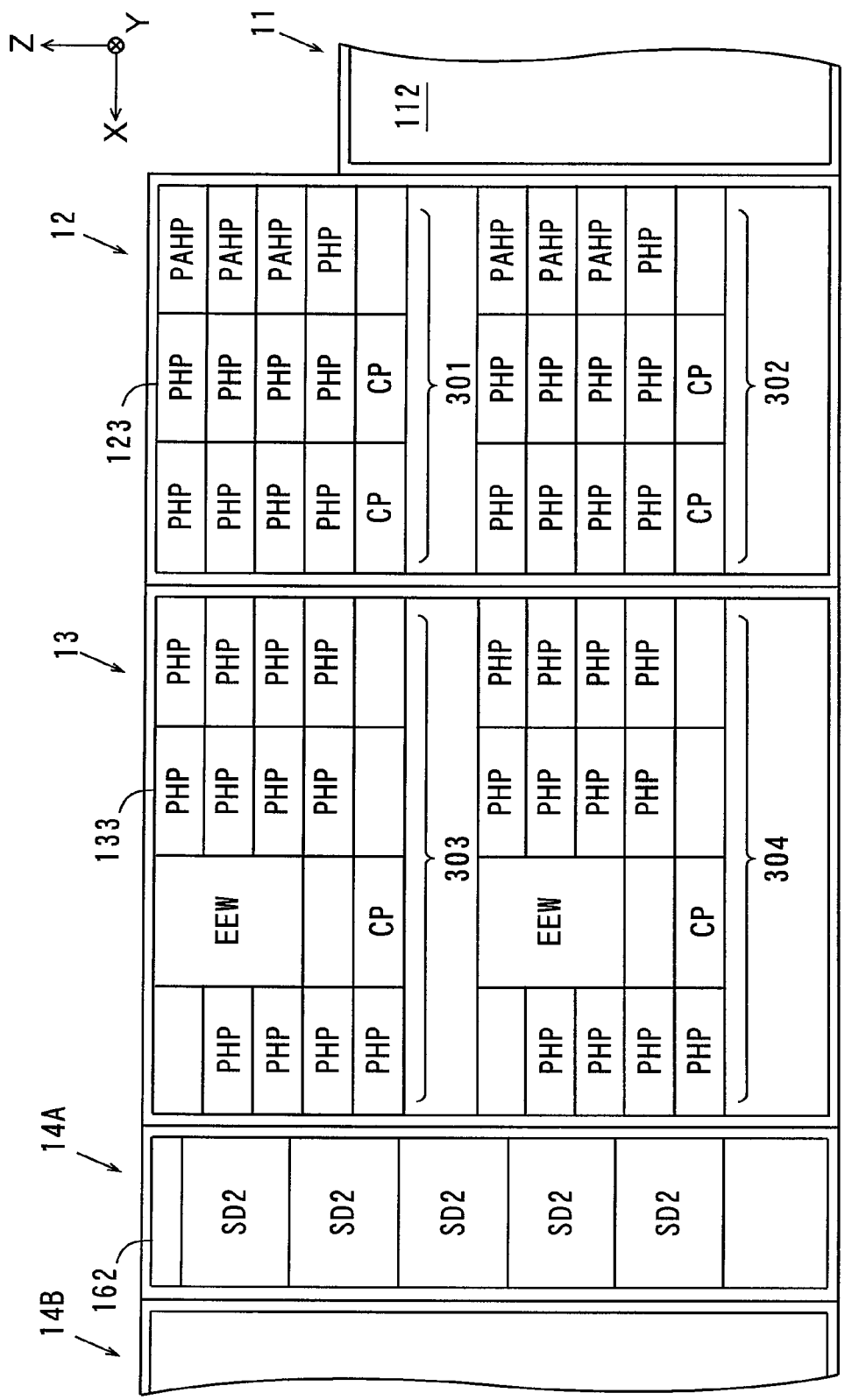
FIG. 3 is a diagram of thermal processing sections and the cleaning/drying processing section of FIG. 1 that are seen from the side in a −Y direction.

FIG. 3 is a diagram of the thermal processing sections 123, 133 and the cleaning/drying processing section 162 of FIG. 1 that are seen from the side in the −Y direction.

As shown in FIG. 3, the thermal processing section 123 has an upper thermal processing section 301 provided above and a lower thermal processing section 302 provided below. The upper thermal processing section 301 and the lower thermal processing section 302 are each provided with a plurality of thermal processing units PHP, a plurality of adhesion reinforcing processing units PAHP and a plurality of cooling units CP.

The substrates W are subjected to thermal processing and cooling processing in the thermal processing units PHP. Adhesion reinforcing processing for improving adhesion between the substrates W and the antireflection films is performed in the adhesion reinforcing processing units PAHP. Specifically, an adhesion reinforcing agent such as HMDS (hexametyldisilazane) is applied to the substrates W and the thermal processing is performed to the substrates W in the adhesion reinforcing processing units PAHP. In the cooling units CP, the substrates W are subjected to the cooling processing.

The thermal processing section 133 includes an upper thermal processing section 303 provided above and a lower thermal processing section 304 provided below. The upper thermal processing section 303 and the lower thermal processing section 304 are each provided with a cooling unit CP, a plurality of thermal processing units PHP and an edge exposure unit EEW.

In the edge exposure unit EEW, the surface condition of the substrate W is inspected, and the exposure processing (the edge exposure processing) is performed to the peripheral portion of the substrate W determined to be normal in the surface condition in the inspection. Here, the peripheral portion of the substrate W refers to a region on the surface of the substrate W having a constant width from the outer edge of the substrate W.

The substrate W is subjected to the edge exposure processing, so that the resist film on the peripheral portion of the substrate W is removed in the subsequent development processing. This prevents the resist film on the peripheral portion of the substrate W from being separated to be particles when the peripheral portion of the substrate W comes in contact with other portions after the development processing.

The substrate W determined not to be normal in the surface condition is not subjected to the edge exposure processing in the edge exposure unit EEW. Details of the edge exposure unit EEW will be described below.

The surface condition of the substrate W refers to the condition of the resist cover film formed on the substrate W in the present embodiment.

The cleaning/drying processing section 162 is provided with a plurality of (five in this example) cleaning/drying processing units SD2. The cleaning and drying processing of the substrate W after the exposure processing is performed in the cleaning/drying processing unit SD2.

(4) Configuration of the Transport Sections (4-1) Schematic Configuration

Figure 4:
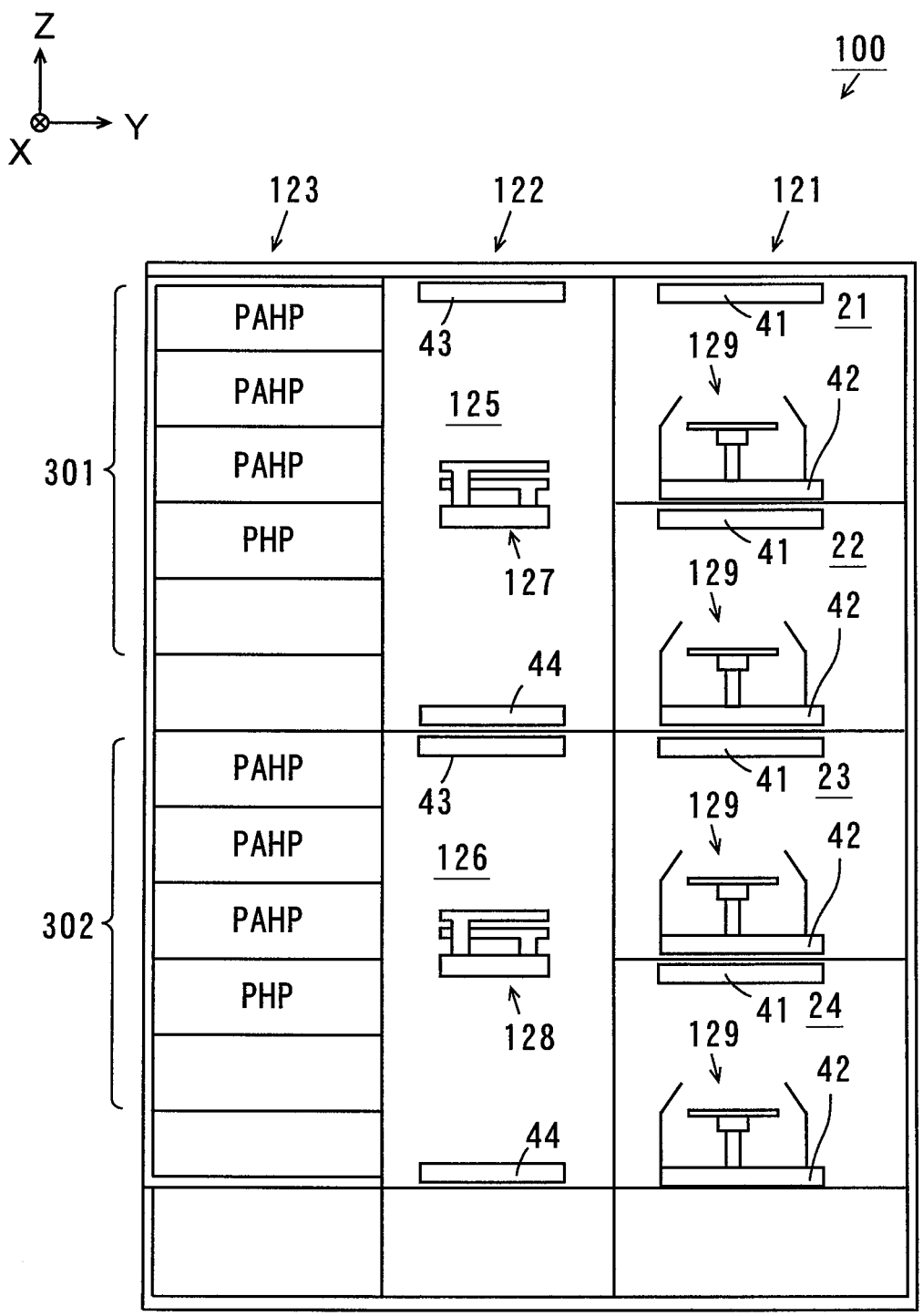
FIG. 4 is a diagram of the coating processing section, a transport section and the thermal processing section of FIG. 1 that are seen from the side in a −X direction.

FIG. 4 is a diagram of the coating processing section 121, the transport section 122 and the thermal processing section 123 of FIG. 1 that are seen from the side in the −X direction. FIG. 5 is a diagram of the transport sections 122, 132, 163 that are seen from the side in the −Y direction.

As shown in FIGS. 4 and 5, the transport section 122 has an upper stage transport chamber 125 and a lower stage transport chamber 126. The transport section 132 has an upper stage transport chamber 135 and a lower stage transport chamber 136.

The transport mechanism 127 is provided in the upper stage transport chamber 125, and the transport mechanism 128 is provided in the lower stage transport chamber 126. The transport mechanism 137 is provided in the upper stage transport chamber 135, and the transport mechanism 138 is provided in the lower stage transport chamber 136.

As shown in FIG. 4, the coating processing chambers 21, 22 are provided to be opposite to the upper thermal processing section 301 with the upper stage transport chamber 125 therebetween, and the coating processing chambers 23, 24 are provided to be opposite to the lower thermal processing section 302 with the lower stage transport chamber 126 therebetween. Similarly, the development processing chamber 31 and the coating processing chamber 32 (FIG. 2) are provided to be opposite to the upper thermal processing section 303 (FIG. 3) with the upper stage transport chamber 135 (FIG. 5) therebetween, and the development processing chamber 33 and the coating processing chamber 34 (FIG. 2) are provided to be opposite to the lower thermal processing section 304 (FIG. 3) with the lower stage transport chamber 136 (FIG. 5) therebetween.

As shown in FIG. 5, the substrate platforms PASS1, PASS2 are provided between the transport section 112 and the upper stage transport chamber 125, and the substrate platforms PASS3, PASS4 are provided between the transport section 112 and the lower stage transport chamber 126. The substrate platforms PASS5, PASS6 are provided between the upper stage transport chamber 125 and the upper stage transport chamber 135, and the substrate platforms PASS7, PASS8 are provided between the lower stage transport chamber 126 and the lower stage transport chamber 136.

The placement/buffer section P-BF1 is provided between the upper stage transport chamber 135 and the transport section 163, and the placement/buffer section P-BF2 is provided between the lower stage transport chamber 136 and the transport section 163. The substrate platform PASS9 and the plurality of cooling platforms P-CP are provided in the transport section 163 so as to be adjacent to the carry-in/carry-out block 14B.

The placement/buffer section P-BF1 is configured such that the substrates W can be carried in and out by the transport mechanism 137 and the transport mechanisms 141, 142 (FIG. 1). The placement/buffer section P-BF2 is configured such that the substrates W can be carried in and out by the transport mechanism 138 and the transport mechanisms 141, 142 (FIG. 1). The substrate platform PASS9 and the cooling platforms P-CP are configured such that the substrates W can be carried in and out by the transport mechanisms 141, 142 (FIG. 1) and the transport mechanism 146.

While the one substrate platform PASS9 is provided in the example of FIG. 5, a plurality of substrate platforms PASS9 may be provided one above another. In this case, the plurality of substrate platforms PASS9 may be used as buffer sections on which the substrates W are temporarily placed.

In the present embodiment, the substrates W to be transported from the indexer block 11 to the first processing block 12 are placed on the substrate platform PASS1 and the substrate platform PASS3, and the substrates W to be transported from the first processing block 12 to the indexer block 11 are placed on the substrate platform PASS2 and the substrate platform PASS4.

The substrates W to be transported from the first processing block 12 to the second processing block 13 are placed on the substrate platform PASS5 and the substrate platform PASS7, and the substrates W to be transported from the second processing block 13 to the first processing block 12 are placed on the substrate platform PASS6 and the substrate platform PASS8.

The substrates W to be transported from the second processing block 13 to the cleaning/drying processing block 14A are placed in the placement/buffer sections P-BF1, P-BF2, the substrates W to be transported from the cleaning/drying processing block 14A to the carry-in/carry-out block 14B are placed in the cooling platforms P-CP, and the substrates W to be transported from the carry-in/carry-out block 14B to the cleaning/drying processing block 14A is placed on the substrate platform PASS9.

An air supply unit 43 is provided above the transport mechanism 127 within the upper stage transport chamber 125, and an air supply unit 43 is provided above the transport mechanism 128 within the lower stage transport chamber 126. An air supply unit 43 is provided above the transport mechanism 137 within the upper stage transport chamber 135, and the air supply unit 43 is provided above the transport mechanism 138 within the lower stage transport chamber 136. Air whose temperature and humidity are adjusted is supplied from a temperature adjustment device, not shown, to the air supply units 43.

In addition, an exhaust unit 44 for exhausting air in the upper stage transport chamber 125 is provided below the transport mechanism 127 within the upper stage transport chamber 125, and an exhaust unit 44 for exhausting air in the lower stage transport chamber 126 is provided below the transport mechanism 128 within the lower stage transport chamber 126.

Similarly, an exhaust unit 44 for exhausting air in the upper stage transport chamber 135 is provided below the transport mechanism 137 within the upper stage transport chamber 135, and an exhaust unit 44 for exhausting air in the lower stage transport chamber 136 is provided below the transport mechanism 138 within the lower stage transport chamber 136.

Accordingly, the atmosphere in the upper stage transport chambers 125, 135 and the lower stage transport chambers 126, 136 is maintained in a clean state with suitable temperature and humidity.

An air supply unit 45 is provided in an upper portion within the transport section 163 of the cleaning/drying processing block 14A. An air supply unit 46 is provided in an upper portion within the carry-in/carry-out block 14B. Air whose temperature and humidity are adjusted is supplied from the temperature adjustment device, not shown, to the air supply units 45, 46. Accordingly, the atmosphere in the cleaning/drying processing block 14A and the carry-in/carry-out block 14B is maintained in a clean state with suitable temperature and humidity.

(4-2) Configuration of the Transport Mechanism

Figure 6:
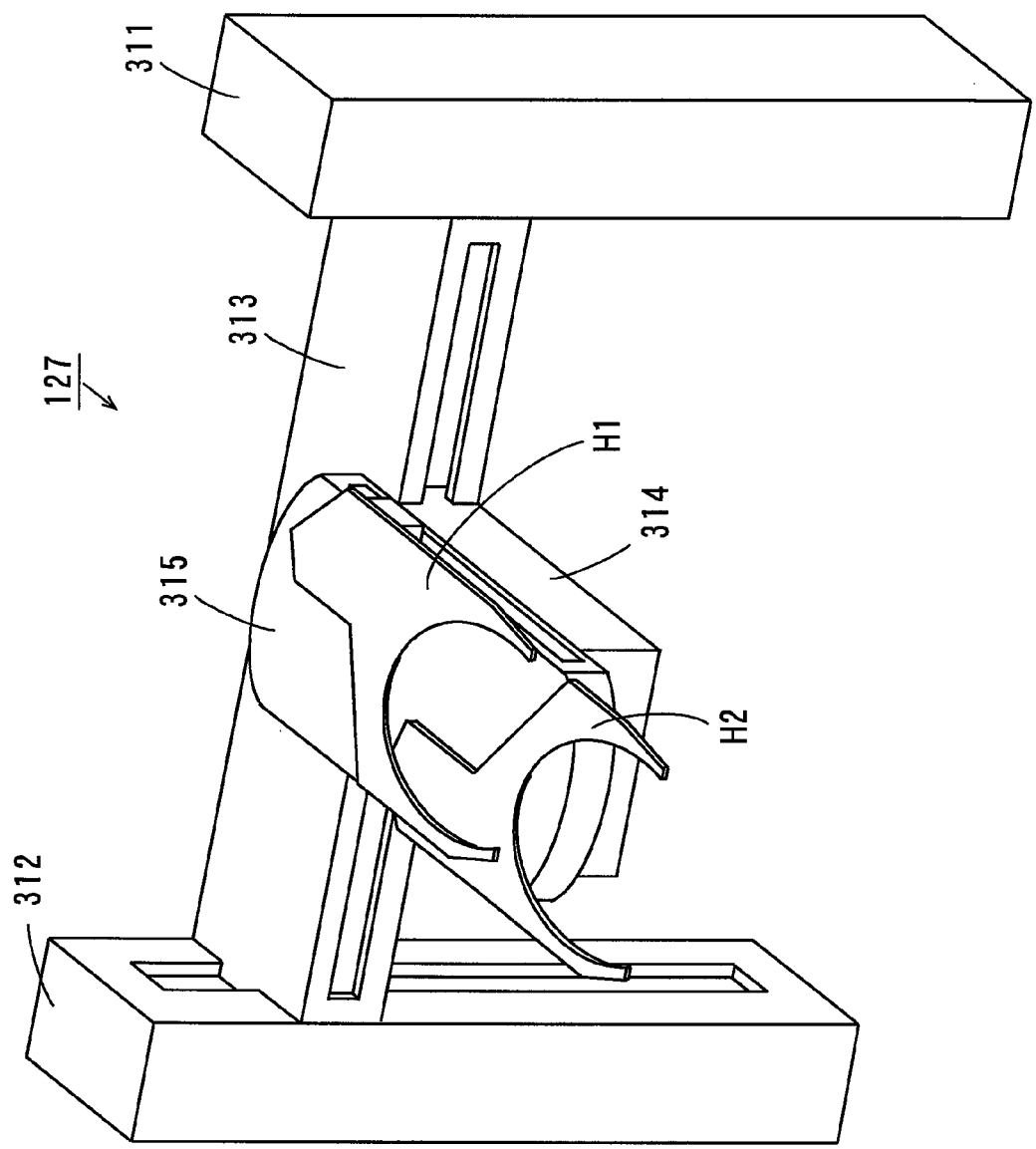
FIG. 6 is a perspective view showing a transport mechanism.

Next, description will be made of the transport mechanism 127. FIG. 6 is a perspective view showing the transport mechanism 127.

As shown in FIGS. 5 and 6, the transport mechanism 127 has long-sized guide rails 311, 312. As shown in FIG. 5, the guide rail 311 is fixed to the side of the transport section 112 to extend in the vertical direction in the upper stage transport chamber 125. The guide rail 312 is fixed to the side of the upper stage transport chamber 135 to extend in the vertical direction in the upper stage transport chamber 125.

As shown in FIGS. 5 and 6, a long-sized guide rail 313 is provided between the guide rail 311 and the guide rail 312. The guide rail 313 is attached to the guide rails 311, 312 in a vertically movable manner. A moving member 314 is attached to the guide rail 313. The moving member 314 is provided in a movable manner in a longitudinal direction of the guide rail 313.

A long-sized rotating member 315 is provided on an upper surface of the moving member 314 in a rotatable manner. A hand H1 and a hand H2 for holding the substrates W are attached to the rotating member 315. The hands H1, H2 are provided in a movable manner in a longitudinal direction of the rotating member 315.

The above-described configuration allows the transport mechanism 127 to freely move in the X direction and the Z direction within the upper stage transport chamber 125. The substrates W can be transferred among the coating processing chambers 21, 22 (FIG. 2), the substrate platforms PASS1, PASS2, PASS5, PASS6 (FIG. 5) and the upper thermal processing section 301 (FIG. 3) using the hands H1, H2.

The transport mechanisms 128, 137, 138 each have the same configuration as the transport mechanism 127 as shown in FIG. 5.

(5) Configuration of the Cleaning/Drying Processing Block

Figure 7:
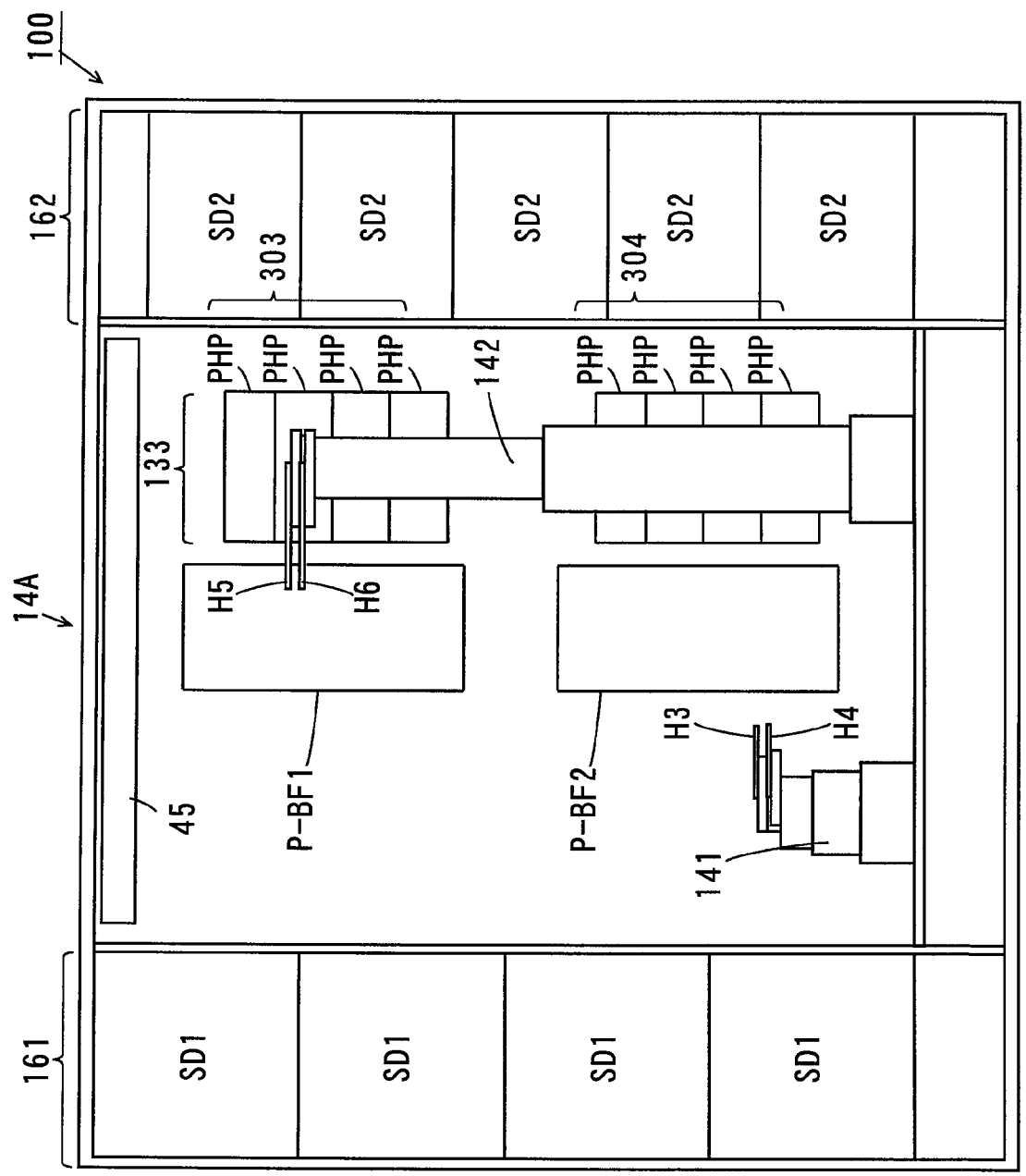
FIG. 7 is a diagram showing the internal configuration of a cleaning/drying processing block.

FIG. 7 is a diagram showing the internal configuration of the cleaning/drying processing block 14A. Note that FIG. 7 is a diagram of the cleaning/drying processing block 14A that is seen from the side in the +X direction.

As shown in FIG. 7, the transport mechanism 141 has hands H3, H4 for holding the substrates W, and the transport mechanism 142 has hands H5, H6 for holding the substrates W.

The cleaning/drying processing units SD1 are hierarchically provided on the +Y side of the transport mechanism 141, and the cleaning/drying processing units SD2 are hierarchically provided on the −Y side of the transport mechanism 142. The placement/buffer sections P-BF1, P-BF2 are provided one above the other on the −X side between the transport mechanisms 141, 142.

The thermal processing units PHP of the upper thermal processing section 303 and the lower thermal processing section 304 are configured such that the substrates W can be carried in from the cleaning/drying processing block 14A.

(6) Operation of Each Component of the Substrate Processing Apparatus

Description will be made of the operation of each component of the substrate processing apparatus 100 according to the present embodiment.

(6-1) Operation of the Indexer Block 11

Description will be made of the operation of the indexer block 11 mainly referring to FIGS. 1 and 5.

First, the carrier 113 that stores unprocessed substrates W is placed on the carrier platform 111 of the indexer block 11 in the substrate processing apparatus 100 according to the present embodiment. The transport mechanism 115 takes one substrate W out of the carrier 113, and transports the substrate W to the substrate platform PASS1. Then, the transport mechanism 115 takes another unprocessed substrate W out of the carrier 113, and transports the substrate W to the substrate platform PASS3 (FIG. 5).

When a processed substrate W is placed on the substrate platform PASS2 (FIG. 5), the transport mechanism 115 transports the unprocessed substrate W to the substrate platform PASS1 and subsequently takes the processed substrate W out of the substrate platform PASS2. Then, the transport mechanism 115 transports the processed substrate W to the carrier 113. Similarly, when a processed substrate W is placed on the substrate platform PASS4, the transport mechanism 115 transports the unprocessed substrate W to the substrate platform PASS3, and subsequently takes the processed substrate W out of the substrate platform PASS4. Then, the processed substrate W is transported to the carrier 113 by the transport mechanism 115 to be stored in the carrier 113.

(6-2) Operation of the First Processing Block 12

Description will be made of the operation of the first processing block 12 mainly referring to FIGS. 1 to 3 and 5. Movement of the transport mechanisms 127, 128 in the X direction and the Z direction is not explained in the following paragraphs for simplicity.

The substrate W placed on the substrate platform PASS1 (FIG. 5) by the transport mechanism 115 (FIG. 5) is taken out by the hand H1 of the transport mechanism 127 (FIG. 5). The transport mechanism 127 places the substrate W held by the hand H2 on the substrate platform PASS2. The substrate W placed on the substrate platform PASS2 by the hand H2 is the substrate W after the development processing.

Next, the transport mechanism 127 takes the substrate W after the adhesion reinforcing processing out of a given adhesion reinforcing processing unit PAHP (FIG. 3) of the upper thermal processing section 301 (FIG. 3) using the hand H2. The transport mechanism 127 carries the unprocessed substrate W held by the hand H1 in the adhesion reinforcing processing unit PAHP.

Next, the transport mechanism 127 takes the substrate W after the cooling processing out of a given cooling unit CP of the upper thermal processing section 301 (FIG. 3) using the hand H1. The transport mechanism 127 carries the substrate W after the adhesion reinforcing processing held by the hand H2 in the cooling unit CP. The substrate W is cooled to a temperature suitable for formation of the antireflection film in the cooling unit CP.

The transport mechanism 127 then takes the substrate W after formation of the antireflection film out of the spin chuck 25 (FIG. 2) of the coating processing chamber 22 (FIG. 2) using the hand H2. The transport mechanism 127 places the substrate W after the cooling processing held by the hand H1 on the spin chuck 25. The antireflection film is formed on the substrate W by the coating processing unit 129 (FIG. 2) in the coating processing chamber 22.

Next, the transport mechanism 127 takes the substrate W after the thermal processing out of a given thermal processing unit PHP of the upper thermal processing section 301 (FIG. 3) using the hand H1. The transport mechanism 127 carries the substrate W after formation of the antireflection film held by the hand H2 in the thermal processing unit PHP. The substrates W are successively subjected to the thermal processing and the cooling processing in the thermal processing unit PHP.

The transport mechanism 127 subsequently takes the substrate W after the cooling processing out of a given cooling unit CP (FIG. 3) of the upper thermal processing section 301 (FIG. 4) using the hand H2. The transport mechanism 127 carries the substrate W after the thermal processing held by the hand H1 in the cooling unit CP. The substrate W is cooled to a temperature suitable for resist film formation processing in the cooling unit CP.

The transport mechanism 127 then takes the substrate W after formation of the resist film out of the spin chuck 25 (FIG. 2) of the coating processing chamber 21 (FIG. 2) using the hand H1. The transport mechanism 127 places the substrate W after the cooling processing held by the hand H2 on the spin chuck 25. The resist film is formed on the substrate W by the coating processing unit 129 (FIG. 2) in the coating processing chamber 22.

Next, the transport mechanism 127 takes the substrate W after the thermal processing out of the given thermal processing unit PHP of the upper thermal processing section 301 (FIG. 3) using the hand H2. The transport mechanism 127 carries the substrate W after formation of the resist film held by the hand H1 in the thermal processing unit PHP.

The transport mechanism 127 then places the substrate W after the thermal processing held by the hand H2 on the substrate platform PASS5 (FIG. 5). The transport mechanism 127 takes the substrate W after the development processing out of the substrate platform PASS6 (FIG. 5) using the hand H2. The transport mechanism 127 subsequently transports the substrate W after the development processing that has been taken out of the substrate platform PASS6 to the substrate platform PASS2 (FIG. 5).

The transport mechanism 127 repeats the foregoing processing to cause the plurality of substrates W to be successively subjected to the given processing in the first processing block 12.

The transport mechanism 128 performs the same operation as the transport mechanism 127 to carry the substrates W in and out of the substrate platforms PASS3, PASS4, PASS7, PASS8 (FIG. 5), the coating processing chambers 23, 24 (FIG. 2) and the lower thermal processing section 302 (FIG. 4).

As described above, the substrates W transported by the transport mechanism 127 are processed in the coating processing chambers 21, 22 and the upper thermal processing section 301, and the substrates W transported by the transport mechanism 128 are processed in the coating processing chambers 23, 24 and the lower thermal processing section 302 in the present embodiment. In this case, the plurality of substrates W can be simultaneously processed in the upper processing sections (the coating processing chambers 21, 22 and the upper thermal processing section 301) and the lower processing sections (the coating processing chambers 23, 24 and the lower thermal processing section 302). This improves throughput of the first processing block 12 without increasing the transport speed of the substrates W by the transport mechanisms 127, 128. The transport mechanisms 127, 128 are provided one above the other, thus preventing an increase of footprint of the substrate processing apparatus 100.

While the substrates W are subjected to the cooling processing in the cooling unit CP before the antireflection film formation processing in the coating processing chamber 22 in the foregoing example, the substrates W may not be subjected to the cooling processing in the cooling unit CP before the formation of the antireflection film if the antireflection film can be properly formed.

(6-3) Operation of the Second Processing Block 13

Description will be made of the operation of the second processing block 13 mainly referring to FIGS. 1 to 3 and 5. Movement of the transport mechanisms 137, 138 in the X direction and the Z direction is not explained in the following paragraphs for simplicity.

The substrate W placed on the substrate platform PASS5 (FIG. 5) by the transport mechanism 127 is taken out by the hand H1 of the transport mechanism 137 (FIG. 5). The transport mechanism 137 places the substrate W held by the hand H2 on the substrate platform PASS6. The substrate W placed on the substrate platform PASS6 by the hand H2 is the substrate W after the development processing.

Next, the transport mechanism 137 takes the substrate W after formation of the resist cover film out of the spin chuck 25 (FIG. 2) of the coating processing chamber 32 (FIG. 2) using the hand H2. The transport mechanism 137 places the substrate W after formation of the resist film held by the hand H1 on the spin chuck 25. The resist cover film is formed on the substrate W by the coating processing unit 129 (FIG. 2) in the coating processing chamber 32.

Next, the transport mechanism 137 takes the substrate W after the thermal processing out of a given thermal processing unit PHP of the upper thermal processing section 303 (FIG. 3) using the hand H1. The transport mechanism 137 carries the substrate W after formation of the resist cover film held by the hand H2 in the thermal processing unit PHP.

The transport mechanism 137 then takes the substrate W after the edge exposure processing out of the edge exposure unit EEW (FIG. 3) using the hand H2. The transport mechanism 137 carries the substrate W after the thermal processing held by the hand H1 in the edge exposure unit EEW. As described above, the surface condition of the substrate W is inspected, and only the substrate W determined to be normal in the surface condition in the inspection is subjected to the edge exposure processing in the edge exposure unit EEW.

In the present embodiment, the components perform different operations to the substrate W determined to be normal in the surface condition and to the substrate W determined not to be normal in the surface condition in the inspection in the edge exposure unit EEW.

Here, description is made of the operation of the components to the substrate W determined to be normal in the surface condition, that is, the substrate W to be subjected to the edge exposure processing. The operation of the components to the substrate W determined not to be normal in the surface condition will be described below.

The transport mechanism 137 places the substrate W after the edge exposure processing held by the hand H2 in the placement/buffer section P-BF1 (FIG. 5), and takes the substrate W after the thermal processing out of the thermal processing unit PHP of the upper thermal processing section 301 (FIG. 4) adjacent to the carry-in/carry-out block 14A using the hand H2. The substrate W taken out of the thermal processing unit PHP adjacent to the carry-in/carry-out block 14A is the substrate W that has been subjected to the exposure processing in the exposure device 15.

Next, the transport mechanism 137 takes the substrate W after the cooling processing out of a given cooling unit CP (FIG. 3) of the upper thermal processing section 303 (FIG. 3) using the hand H1. The transport mechanism 137 carries the substrate W after the exposure processing held by the hand H2 in the cooling unit CP. The substrate W is cooled to a temperature suitable for the development processing in the cooling unit CP.

The transport mechanism 137 then takes the substrate W after the development processing out of the spin chuck 35 (FIG. 2) of the development processing chamber 31 (FIG. 2) using the hand H2. The transport mechanism 137 places the substrate W after the cooling processing held by the hand H1 on the spin chuck 35. Removing processing of the resist cover film and the development processing are performed by the development processing unit 139 in the development processing chamber 31.

Next, the transport mechanism 137 takes the substrate W after the thermal processing out of a given thermal processing unit PHP of the upper thermal processing section 303 (FIG. 4) using the hand H1. The transport mechanism 137 carries the substrate W after the development processing held by the hand H2 to the thermal processing unit PHP. Then, the transport mechanism 137 places the substrate W taken out of the thermal processing unit PHP on the substrate platform PASS6 (FIG. 5).

The transport mechanism 137 repeats the foregoing processing to cause the plurality of substrates W to be successively subjected to the given processing in the second processing block 13.

The transport mechanism 138 performs the same operation as the transport mechanism 137 to carry the substrates W in and out of the substrate platforms PASS7, PASS8, the placement/buffer section P-BF2 (FIG. 5), the development processing chamber 33 (FIG. 2), the coating processing chamber 34 (FIG. 2) and the lower thermal processing section 304 (FIG. 3).

As described above, the substrates W transported by the transport mechanism 137 are processed in the development processing chamber 31, the coating processing chamber 32 and the upper thermal processing section 303, and the substrates W transported by the transport mechanism 138 are processed in the development processing chamber 33, the coating processing chamber 34 and the lower thermal processing section 304 in the present embodiment. In this case, the plurality of substrates W can be simultaneously processed in the upper processing sections (the development processing chamber 31, the coating processing chamber 32 and the upper thermal processing section 303) and the lower processing sections (the development processing chamber 33, the coating processing chamber 34 and the lower thermal processing section 304). This improves throughput of the second processing block 13 without increasing the transport speed of the substrates W by the transport mechanisms 137, 138. The transport mechanisms 137, 138 are provided one above the other, thus preventing an increase of footprint of the substrate processing apparatus 100.

While the substrates W are subjected to the cooling processing in the cooling unit CP before the development processing in the development processing chamber 31 in the foregoing example, the substrates W may not be subjected to the cooling processing in the cooling unit CP before the development processing if the development processing can be properly performed.

(6-4) Operations of the Cleaning/Drying Processing Block 14A and the Carry-In/Carry-Out Block 14B Description will be made of the operations of the cleaning/drying processing block 14A and the carry-in/carry-out block 14B mainly referring to FIGS. 5 and 7.

In the cleaning/drying processing block 14A, the transport mechanism 141 (FIG. 7) takes out the substrate W after the edge exposure placed in the placement/buffer section P-BF1 by the transport mechanism 137 (FIG. 5) using the hand H3.

Next, the transport mechanism 141 takes the substrate W after the cleaning processing and the drying processing out of the given cleaning/drying processing unit SD1 of the cleaning/drying processing section 161 (FIG. 7) using the hand H4. The transport mechanism 141 carries the substrate W after the edge exposure held by the hand H3 to the cleaning/drying processing unit SD1.

The transport mechanism 141 subsequently places the substrate W after the cleaning processing and the drying processing held by the hand H4 in the cooling platform P-CP (FIG. 5). In the cooling platform P-CP, the substrate W is cooled to a temperature suitable for the exposure processing in the exposure device 15 (FIG. 1).

The transport mechanism 141 then takes out the substrate W after the edge exposure placed in the placement/buffer section P-BF2 by the transport mechanism 138 (FIG. 5) using the hand H3. The transport mechanism 141 then takes the substrate W after the cleaning processing and the drying processing out of the given cleaning/drying processing unit SD1 of the cleaning/drying processing section 161 (FIG. 7) using the hand H4. The transport mechanism 141 carries the substrate W after the edge exposure held by the hand H3 in the cleaning/drying processing unit SD1. Next, the transport mechanism 141 places the substrate W after the cleaning processing and the drying processing held by the hand H4 in the cooling platform P-CP (FIG. 5).

In this manner, the transport mechanism 141 alternately transports the substrates W after the edge exposure placed in the placement/buffer sections P-BF1, P-BF2 to the cooling platforms P-CP via the cleaning/drying processing section 161.

Here, the substrates W stored in the carrier 113 (FIG. 5) are alternately transported to the substrate platforms PASS1, PASS3 (FIG. 5) by the transport mechanism 115 (FIG. 5). The processing speed of the substrates W in the coating processing chambers 21, 22 (FIG. 2) and the upper thermal processing section 301 (FIG. 3) is substantially equal to that in the coating processing chambers 23, 24 (FIG. 2) and the lower thermal processing section 302 (FIG. 3).

The operation speed of the transport mechanism 127 (FIG. 5) is substantially equal to that of the transport mechanism 128 (FIG. 5). The processing speed of the substrates W in the development processing chamber 31 (FIG. 2), the coating processing chamber 32 (FIG. 2) and the upper thermal processing section 303 (FIG. 3) is substantially equal to that in the development processing chamber 33 (FIG. 2), the coating processing chamber 34 (FIG. 2) and the lower thermal processing section 304 (FIG. 3). The operation speed of the transport mechanism 137 (FIG. 5) is substantially equal to that of the transport mechanism 138 (FIG. 5).

As described above, the substrates W are alternately transported by the transport mechanism 141 (FIG. 7) from the placement/buffer sections P-BF1, P-BF2 (FIG. 5) to the cooling platforms P-CP, so that the order of the substrates W carried from the carriers 113 into the substrate processing apparatus 100 coincides with the order of the substrates W transported from the cleaning/drying processing block 14A into the cooling platforms P-CP (FIG. 5). In this case, the processing history of each substrate W in the substrate processing apparatus 100 is easily managed.

The transport mechanism 142 (FIG. 7) takes out the substrate W after the exposure processing placed in the substrate platform PASS9 (FIG. 5) using the hand H5. Next, the transport mechanism 142 takes the substrate W after the cleaning processing and the drying processing out of the given cleaning/drying processing unit SD2 of the cleaning/drying processing section 162 (FIG. 7) using the hand H6. The transport mechanism 142 carries the substrate W after the exposure processing held by the hand H5 in the cleaning/drying processing unit SD2.

Next, the transport mechanism 142 transports the substrate W after the cleaning processing and the drying processing held by the hand H6 to the thermal processing unit PHP (FIG. 7) of the upper thermal processing section 303. Post exposure bake (PEB) processing is performed in the thermal processing unit PHP.

The transport mechanism 142 (FIG. 7) subsequently takes out the substrate W after the exposure processing placed on the substrate platform PASS9 (FIG. 5) using the hand H5. Next, the transport mechanism 142 takes the substrate W after the cleaning processing and the drying processing out of the given cleaning/drying processing unit SD2 of the cleaning/drying processing section 162 (FIG. 7) using the hand H6. The transport mechanism 142 carries the substrate W after the exposure processing held by the hand H5 in the cleaning/drying processing unit SD2.

The transport mechanism 142 then transports the substrate W after the cleaning processing and the drying processing held by the hand H6 to the thermal processing unit PHP (FIG. 7) of the lower thermal processing section 304. The PEB processing is performed in the thermal processing unit PHP.

In this manner, the transport mechanism 142 alternately transports the substrates W after the exposure processing placed in the substrate platform PASS9 to the upper thermal processing section 303 and the lower thermal processing section 304 via the cleaning/drying processing section 162.

In the carry-in/carry-out block 14B, the transport mechanism 146 (FIG. 5) takes out the substrate W placed in the cooling platform P-CP using the hand H7, and transports the substrate W to the substrate carry-in section 15a of the exposure device 15. The transport mechanism 146 takes the substrate W after the exposure processing out of the substrate carry-out section 15b of the exposure device 15 using the hand H8, and transports the substrate W to the substrate platform PASS9.

Here, as described above, the order of the substrates W placed in the cooling platforms P-CP (FIG. 5) by the transport mechanism 141 (FIG. 7) is equal to the order of the substrates W carried from the carriers 113 (FIG. 5) into the substrate processing apparatus 100. This allows the order of the substrates W carried from the carriers 113 into the substrate processing apparatus 100 to coincide with the order of the substrates W carried in the exposure device 15 by the transport mechanism 142 (FIG. 7). Accordingly, the processing history of each substrate W in the exposure device 15 is easily managed, and variation in the state of the exposure processing among the plurality of substrates W carried from one carrier 113 to the substrate processing apparatus 100 can be prevented.

When the exposure device 15 cannot receive the substrate W, the transport mechanism 141 (FIG. 7) causes the substrates W after the cleaning processing and the drying processing to be temporarily stored in the placement/buffer sections P-BF1, P-BF2.

When the development processing unit 139 (FIG. 2) of the second processing block 13 cannot receive the substrate W after the exposure processing, the transport mechanisms 137, 138 (FIG. 5) cause the substrates W after the PEB processing to be temporarily stored in the placement/buffer sections P-BF1, P-BF2.

When the substrates W are not normally transported to the placement/buffer sections P-BF1, P-BF2 due to a malfunction or the like of the first and second processing blocks 12, 13, transportation of the substrates W from the placement/buffer sections P-BF1, P-BF2 by the transport mechanism 141 may be temporarily stopped until the transportation of the substrates W is normalized.

(7) Details of the Edge Exposure Unit

Figure 8:
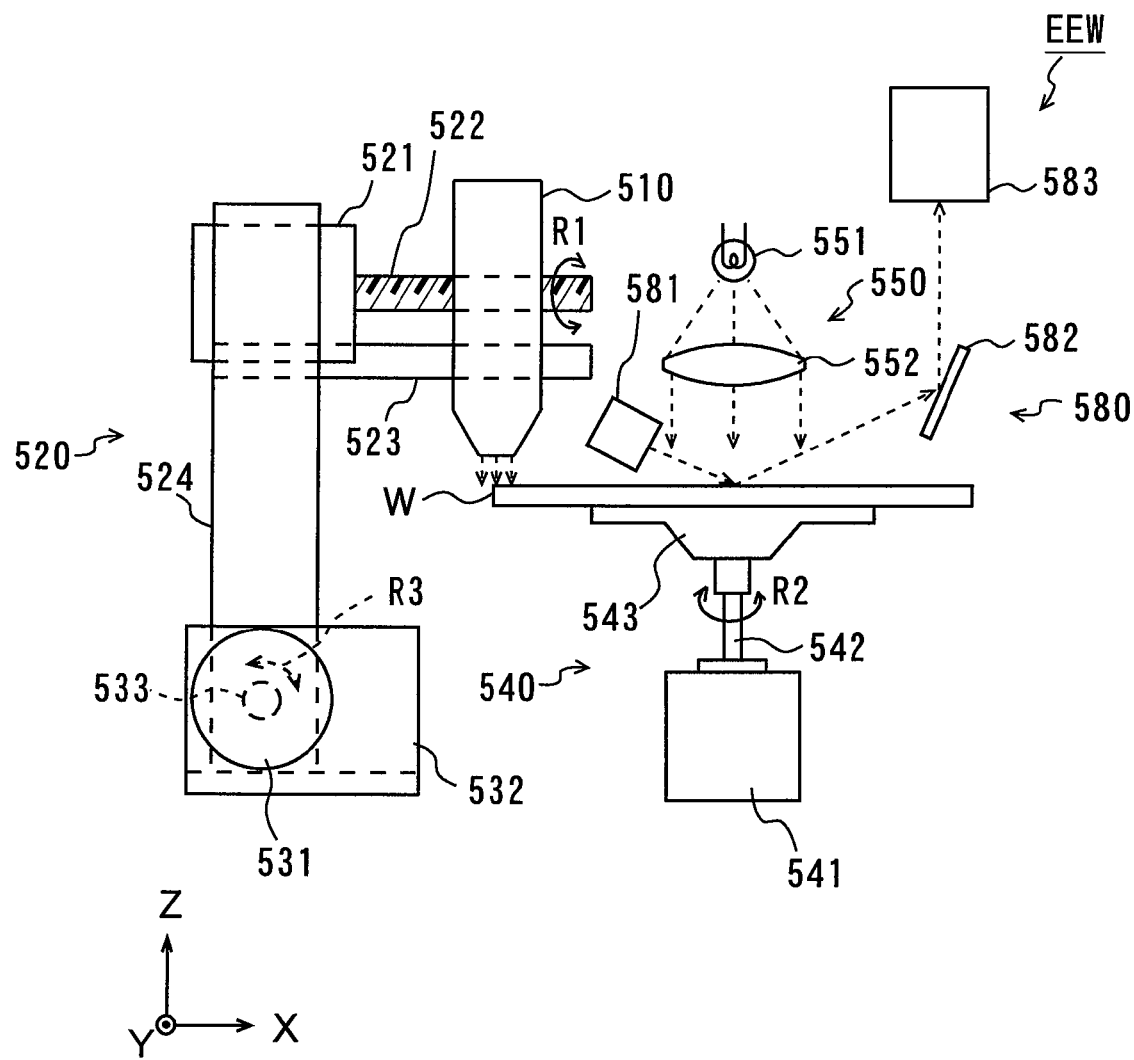
FIG. 8 is a diagram schematically showing one side of an edge exposure unit.

Next, description is made of details of the edge exposure unit EEW. FIG. 8 is a diagram schematically showing one side of the edge exposure unit EEW, FIG. 9 is a diagram schematically showing another side of the edge exposure unit EEW, and FIG. 10 is a schematic plan view of the edge exposure unit EEW.

As shown in FIGS. 8 and 9, the edge exposure unit EEW includes a projector 510, a projector holding unit 520, a substrate rotating unit 540, an outer edge detecting unit 550 and a surface inspection processing unit 580.

The projector 510 is connected to a light source for exposure (not shown) that is described below through a light guide composed of a fiber-optic cable and so on. Thus, the projector 510 irradiates the peripheral portion of the substrate W with light transmitted by the light source for exposure through the light guide. Hereinafter, the light directed to the substrate W by the projector 510 for exposing the resist film on the substrate W to light is referred to as the exposure light.

The projector holding unit 520 includes an X direction driving motor 521, an X direction ball screw 522, a projector holding guide 523, a column 524, a Y direction driving motor 531, a column holding guide 532 and a Y direction ball screw 533.

The projector 510 is movably held in the X direction by the projector holding guide 523. The X direction ball screw 522 is screwed in a coupling portion, not shown, provided in the projector 510.

The X direction ball screw 522 is provided to extend in the X direction, and is rotated in a direction of the arrow R1 according to the operation of the X direction driving motor 521. The X direction ball screw 522 is rotated, thereby causing the projector 510 to move in the X direction.

The X direction driving motor 521 and the projector holding guide 523 are supported at given heights by the column 524. A lower end of the column 524 is held by the column holding guide 532. The column 524 is movably held in the Y direction by the column holding guide 532. The Y direction ball screw 533 is screwed in a coupling portion, not shown, provided in the column 524.

The Y direction ball screw 533 is provided to extend in the Y direction, and is rotated in a direction of the arrow R3 according to the operation of the Y direction driving motor 531. The Y direction ball screw 533 is rotated, thereby causing the column 524 to move in the Y direction.

In this manner, each component of the projector holding unit 520 operates to cause the projector 510 to move in the X direction and the Y direction.

The substrate rotating unit 540 includes a substrate rotating motor 541, a substrate rotating shaft 542 and a spin chuck 543. The substrate rotating shaft 542 projects upward from the substrate rotating motor 541. The spin chuck 543 is connected to an upper end of the substrate rotating shaft 542. The substrate W is placed on the spin chuck 543 during the edge exposure processing. The spin chuck 543 holds the placed substrate W by suction.

The substrate rotating motor 541 rotates the substrate rotating shaft 542 in a direction of the arrow R2. Thus, the spin check 543 is rotated to cause the substrate W held thereon by suction to be rotated.

The outer edge detecting unit 550 includes a sensor light source 551, a lens 552 and a CCD (Charge-Coupled Device) line sensor 553 (FIG. 9).

As shown in FIGS. 9 and 10, the sensor light source 551 and the lens 552 are disposed above the peripheral portion of the substrate W held by suction on the spin chuck 543. The CCD line sensor 553 is disposed in a position opposite to the sensor light source 551 and the lens 552 with the outer edge of the substrate W therebetween.

Light (hereinafter referred to as sensor light) for obtaining the shape of the outer edge of the substrate W is generated from the sensor light source 551. The sensor light passes through the lens 552 to be shaped, and projected onto the CCD line sensor 553.

As shown in FIGS. 9 and 10, the CCD line sensor 553 is disposed such that the outer edge of the substrate W is positioned within an effective pixel region of the CCD line sensor 553. This causes part of the sensor light projected onto the CCD line sensor 553 to be interrupted by the substrate W. Accordingly, the outer edge of the substrate W above the CCD line sensor 553 can be detected based on distribution of an amount of light received in the CCD line sensor 553. In the present embodiment, edge sampling processing, described below, is performed based on the distribution of the amount of the light received in the CCD line sensor 553.

The surface inspection processing unit 580 includes an illuminator 581, a reflecting mirror 582 and a CCD line sensor 583.

As shown in FIG. 10, the illuminator 581 is disposed along the Y direction above the substrate W. The length of the illuminator 581 in the Y direction is set larger than the radius of the substrate W.

The reflecting mirror 582 is disposed above the substrate W to be opposite to the illuminator 581. The CCD line sensor 583 is disposed above the reflecting mirror 582. The CCD line sensor 583 is disposed such that pixels are arranged along the Y direction.

Strip-shaped light (hereinafter referred to as illumination light) for inspecting the surface condition of the substrate W is generated from the illuminator 581. The illumination light is directed to a strip-shaped region (hereinafter referred to as a radius region) on the surface of the substrate W along the radius direction of the substrate W. The directed illumination light is reflected on the substrate W, and further reflected on the reflecting mirror 582 to be projected onto the CCD line sensor 583. Distribution of an amount of the light received in the CCD line sensor 583 corresponds to distribution of brightness of the reflected light in the radius region.

The distribution of brightness of the reflected light on the surface of the substrate W is different depending on the surface condition of the substrate W. Specifically, when the resist cover film is formed in a flat shape on the substrate W, the reflected light on the surface of the substrate W has substantially constant brightness. When the resist cover film has unevenness or has a hole (pin hole) formed therein, brightness of the reflected light on the surface of the substrate W has a wide range of variation.

The surface inspection processing, described below, is performed based on the distribution of the amount of the light received in the CCD line sensor 583 in the present embodiment.

FIG. 11 is a block diagram showing a relationship between each component of the edge exposure unit EEW and the controller 114 of FIG. 1.

As shown in FIG. 11, each of the CCD line sensors 553, 583, the substrate rotating motor 541, the X direction driving motor 521, the Y direction driving motor 531, the light source for exposure 570, the main panel PN and the operation unit 90 is connected to the controller 114.

The controller 114 controls operations of the CCD line sensors 553, 583, the substrate rotating motor 541, the X direction driving motor 521, the Y direction driving motor 531, the light source for exposure 570 and the main panel PN. The distributions of the amounts of the light received in the CCD line sensors 553, 583 are applied to the controller 114. Information indicating the operation of the operation unit 90 by a user is applied to the controller 114.

Here, description is made of the edge sampling processing and the surface inspection processing.

In the edge sampling processing, an orientation flat or a notch for positioning formed at the outer edge of the substrate W and an amount of eccentricity of the substrate W are detected based on the distribution of the amount of the light received in the CCD line sensor 553.

As described above, the position of the outer edge of the substrate W above the CCD line sensor 553 can be detected based on the distribution of the amount of the light received in the CCD line sensor 553. One rotation of the substrate W causes the entire outer edge of the substrate W to pass above the CCD line sensor 553. The distribution of the amount of the light received in the CCD line sensor 553 is successively applied to the controller 114 during a period of one rotation of the substrate W. This allows the controller 114 to detect the shape of the outer edge of the substrate W and a distance from the rotation center of the substrate W to the outer edge of the substrate W. Accordingly, the controller 114 can detect the notch in the outer edge of the substrate W and the amount of eccentricity of the substrate W.

In the surface inspection processing, the surface condition of the substrate W (the condition of the resist cover film) is inspected based on the distribution of the amount of the light received in the CCD line sensor 583.

As described above, the distribution of the amount of the light received in the CCD line sensor 583 corresponds to the distribution of brightness of the reflected light in the radius region of the substrate W.

One rotation of the substrate W causes the entire substrate W to be irradiated with the illumination light. The distribution of the amount of the light received in the CCD line sensor 583 is successively applied to the controller 114 during the period of one rotation of the substrate W. The controller 114 creates surface image data indicating the distribution of brightness of the reflected light in the entire surface of the substrate W based on the distribution of the amount of the light received in the CCD line sensor 583.

Figure 12:
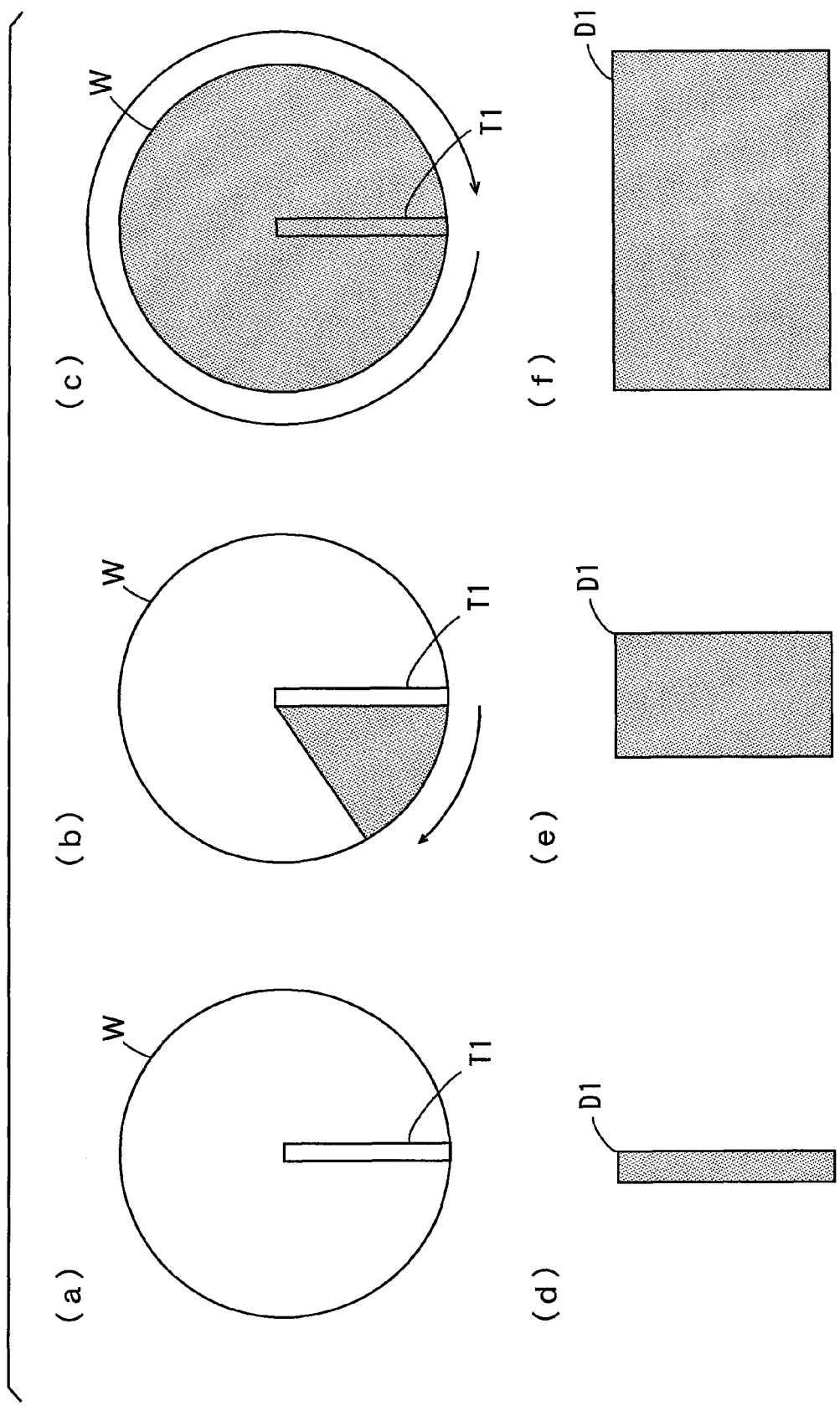
FIG. 12 is a diagram for explaining a method of creating surface image data.

FIG. 12 is a diagram for explaining a method of creating the surface image data. FIG. 12 (a), (b), (c) show irradiated states of the substrate W with the illumination light, and FIG. 12 (d), (e), (f) show the respective surface image data created in the states of FIG. 12 (a), (b), (c). A region on the substrate W irradiated with the illumination light is indicated by hatching in each of FIG. 12 (a) to (c).

As shown in FIG. 12 (a) to (c), the substrate W is rotated while the radius region T1 on the substrate W is continuously irradiated with the illumination light. This causes the substrate W to be successively irradiated with the illumination light in its circumferential direction. One rotation of the substrate W causes the entire surface of the substrate W to be irradiated with the illumination light.

As shown in FIG. 12 (d) to (f), rectangular surface image data D1 is created based on the distribution of the amount of the light received in the CCD line sensor 583 that is successively obtained in the period of one rotation of the substrate W.

The ordinate of the surface image data D1 corresponds to the respective positions of the pixels of the CCD line sensor 583, and the abscissa of the surface image data D1 corresponds to a rotation angle of the substrate W.

In this case, the amount of the light received in each pixel of the CCD line sensor 583 at one time point is indicated along the ordinate of the surface image data D1. That is, the distribution of brightness of the reflected light in the radius region T1 of the substrate W is indicated along the ordinate of the surface image data D1.

Change in the amount of the light received in each pixel of the CCD line sensor 583 caused by the rotation of the substrate W is indicated along the abscissa of the surface image data D1. That is, the distribution of brightness of the reflected light on the surface of the substrate W in the circumferential direction of the substrate W is indicated along the abscissa of the surface image data D1.

The distribution of brightness of the reflected light on the entire surface of the substrate W is obtained as one rectangular surface image data D1 at a time point of one rotation of the substrate W.

Figure 13:
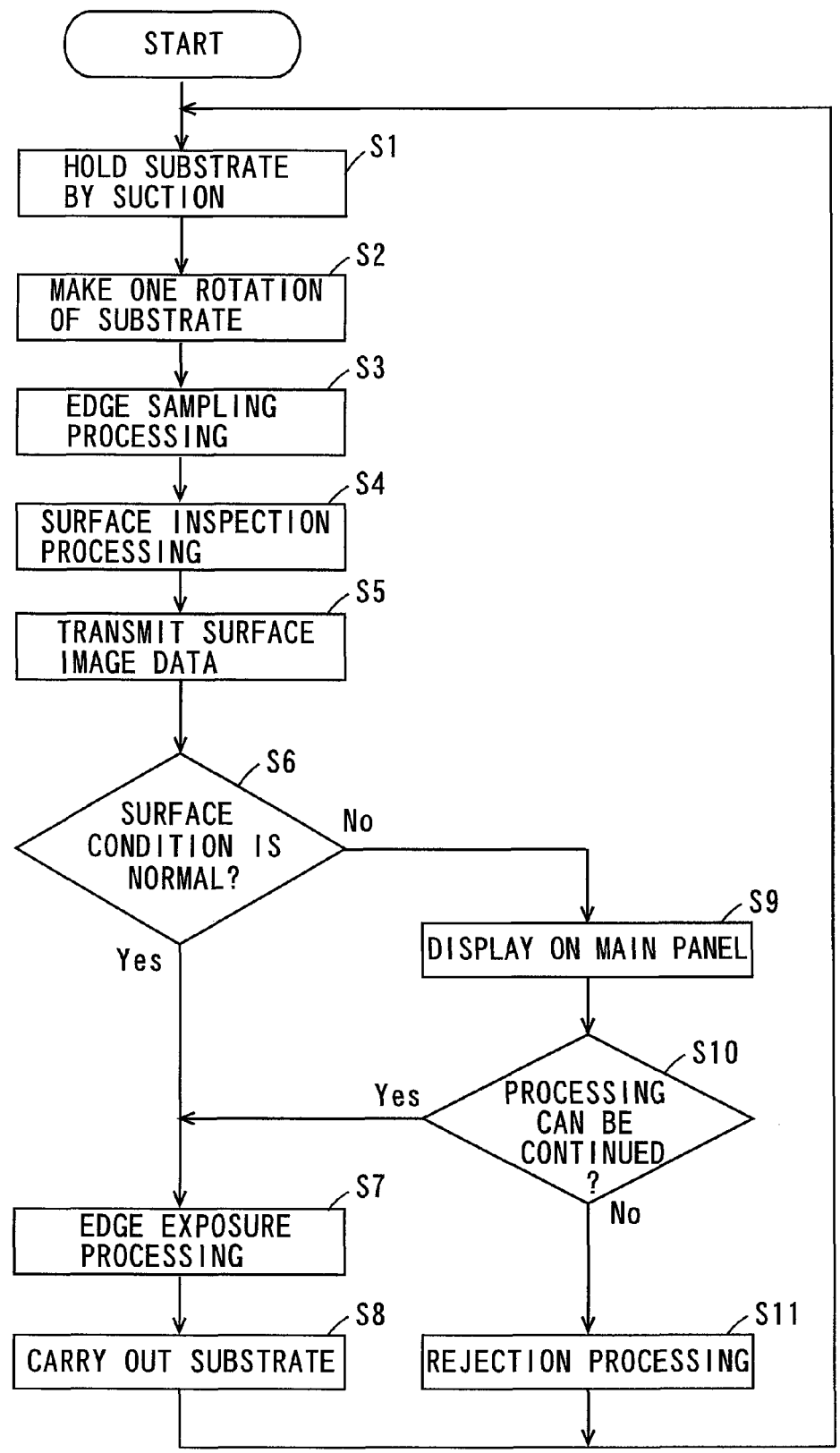
FIG. 13 is a flowchart showing operation of the controller in the edge exposure unit.

FIG. 13 is a flowchart showing the operation of the controller 114 in the edge exposure unit EEW. Here, description is made of the operation of the controller 114 in the edge exposure unit EEW of the upper thermal processing section 303.

First, the controller 114 causes the substrate W to be placed on the spin chuck 543 using the transport mechanism 137 (FIG. 1), and causes the spin chuck 543 to hold the substrate W by suction (Step S1).

Next, the controller 114 causes the spin chuck 543 to make one rotation of the substrate W (Step S2). The controller 114 performs the foregoing edge sampling processing and surface inspection processing during the period of one rotation of the substrate W (Steps S3, S4).

The controller 114 then transmits the created surface image data D1 to the host computer 800 of FIG. 1 (Step S5). The host computer 800 stores the surface image data D1 transmitted from the controller 114. The user can confirm the surface image data as necessary using the host computer 800 or a terminal connected to the host computer 800.

The controller 114 may store the surface image data D1. In the case, the user can confirm the surface image data D1 as necessary using the main panel PN. The surface image data D1 can be transmitted from the controller 114 to the host computer 800 at arbitrary timings.

The controller 114 subsequently determines whether or not the surface condition of the substrate W is normal based on the created surface image data D1 (Step S6).

Specifically, the controller 114 determines whether or not the entire surface image data D1 has brightness in a predetermined range. When the entire surface image data D1 has the brightness in the predetermined range, the controller 114 determines that the surface condition of the substrate W is normal.

When at least part of the surface image data D1 does not have the brightness in the predetermined range, the controller 114 determines that the surface condition of the substrate W is not normal.

When the surface condition of the substrate W is determined to be normal, the controller 114 causes the substrate W to be rotated by the spin chuck 543 and causes the projector 510 to irradiate the peripheral portion of the substrate W with the exposure light, thereby subjecting the substrate W to the edge exposure processing (Step S7).

In the edge exposure processing, the substrate W is positioned based on the notch of the substrate W detected in the edge sampling processing, and the position of the projector 510 is corrected by the projector holding unit 520 based on the amount of eccentricity of the substrate W detected in the edge sampling processing.

After the edge exposure processing is finished, the controller 114 causes the substrate W to be carried out from the edge exposure unit EEW using the transport mechanism 137 (FIG. 1) (Step S8), and then returns to the process of Step S1.

When the surface condition of the substrate W is determined not to be normal, the controller 114 corrects the rectangular surface image data D1 that has been created to the shape of the substrate W (the circular shape) and displays the data D1 on the main panel PN (Step S9). The controller 114 may transmit the surface image data D1 that is corrected to obtain the circular shape to the host computer 800 of FIG. 1.

The user makes determination as to whether or not the processing of the substrate W should be continued based on the surface image data D1 displayed on the main panel PN, and inputs the determination to the operation unit 90. In this case, the surface image data D1 is corrected to obtain the shape of the substrate W, so that the user can recognize the surface condition of the substrate W at a glance.

The controller 114 determines whether or not the processing of the substrate W can be continued based on the operation of the operation unit 90 by the user (Step S10).

When the processing of the substrate W can be continued, the controller 114 proceeds to the process of Step S7.

When the processing of the substrate W cannot be continued, the controller 114 performs rejection processing (Step S11), described below, and returns to the process of Step S1.

The processing of the substrate W is performed in the edge exposure unit EEW of the lower thermal processing section 303 in the same manner as in the foregoing except that the transport mechanism 138 carries in and out the substrate W.

A method of inspecting the surface condition of the substrate W is not limited to the foregoing example. For example, the controller 114 previously stores the surface image data D1 when the surface condition of the substrate W is normal. The controller 114 calculates a rate of approximation of the previously stored surface image data D1 and the surface image data D1 created based on the distribution of the amount of the light received in the CCD line sensor 583. The controller 114 determines that the surface condition of the substrate W is normal when the calculated rate of approximation is not less than a threshold value, and determines that the surface condition of the substrate W is not normal when the rate of approximation is lower than the threshold value.

(8) The Rejection Processing

The substrate W determined to be normal in the surface condition in the edge exposure unit EEW is sequentially subjected to the edge exposure processing in the edge exposure unit EEW, the exposure processing in the exposure device 15, the PEB processing in the upper thermal processing section 303 and the lower thermal processing section 304, and the development processing in the development processing chambers 31, 33, and then transported to the carrier 113 as described above.

On the other hand, the substrate W determined not to be normal in the surface condition is not subjected to the subsequent processing, and transported to the carrier 113. Hereinafter, description is made of the rejection processing for the substrate W determined not to be normal in the surface condition. In the following description, the substrate W determined to be normal in the surface condition is referred to as the normal substrate W, and the substrate W determined not to be normal in the surface condition is referred to as the defective substrate W.

The defective substrate W found in the edge exposure unit EEW of the upper thermal processing section 303 is taken out of the edge exposure unit EEW by the transport mechanism 137, and placed on the placement/buffer section P-BF1.

After a given period of time, the defective substrate W is taken out of the placement/buffer section P-BF1 by the transport mechanism 137, and placed on the substrate platform PASS6. Then, the defective substrate W is taken out of the substrate platform PASS6 by the transport mechanism 127, and placed on the substrate platform PASS2. The defective substrate W is subsequently taken out of the substrate platform PASS2 by the transport mechanism 115, and transported to the carrier 113.

Similarly, the defective substrate W found in the edge exposure unit EEW of the lower thermal processing section 304 is taken out of the edge exposure unit EEW by the transport mechanism 138, and placed on the placement/buffer section P-BF2.

After the given period of time, the defective substrate W is taken out of the placement/buffer section P-BF2 by the transport mechanism 138, and placed on the substrate platform PASS8. Then, the defective substrate W is taken out of the substrate platform PASS8 by the transport mechanism 128, and placed on the substrate platform PASS4. The defective substrate W is subsequently taken out of the substrate platform PASS4 by the transport mechanism 115, and transported to the carrier 113.

In the present embodiment, the defective substrates W are made to wait for the given period of time in the placement/buffer sections P-BF1, P-BF2 such that the defective substrate W and the normal substrate W need equal time periods from the time when being taken out of the edge exposure unit EEW to the time when being transported to the substrate platforms PASS6, PASS8.

In this case, the order of the substrates W carried into the edge exposure unit EEW of the upper thermal processing section 303 coincides with the order of the substrates W placed on the substrate platform PASS6 even when the plurality of normal substrates W and the plurality of defective substrates W are mixed. Similarly, the order of the substrates W carried into the edge exposure unit EEW of the lower thermal processing section 304 coincides with the order of the substrates W placed on the substrate platform PASS8.

A transport path from the substrate platforms PASS6, PASS8 to the carrier 113 is common for the defective substrate W and the normal substrate W. Therefore, the defective substrate W and the normal substrate W are returned to the carriers 113 in the order of being placed on the substrate platform PASS6, and the defective substrate W and the normal substrate W are returned to the carrier 113 in the order of being placed on the substrate platform PASS8.

Accordingly, the order of the substrates W carried into the edge exposure unit EEW of the upper thermal processing section 303 and the lower thermal processing section 304 coincides with the order of the substrates W returned to the carriers 113. This causes the processing history of each substrate W to be easily managed, and the defective substrate W and the normal substrate W to be easily distinguished.

The operations of the transport mechanisms 116, 126, 127 do not change regardless of the presence/absence of the defective substrate W. Therefore, control of the transport mechanisms 115, 126, 127 is prevented from being complicated.

(9) Effects of the Present Embodiment (9-1)

In the present embodiment, the surface condition of the substrate W is inspected in the edge exposure unit EEW, and the substrate W determined not to be normal in the surface condition in the inspection is not subjected to the subsequent processing. Accordingly, only the substrate W that is normal in the surface condition is subjected to the exposure processing using the liquid immersion method in the exposure device 15.

This prevents the possibility that a liquid supplied onto the substrate W is not held on the substrate W and flows to the outside of the substrate W in the exposure device 15. Accordingly, an electrical system and so on of the exposure device 15 is prevented from being damaged by the outward flow of the liquid, and change in the temperature within the exposure device 15 to be caused by the outward flow of the liquid is prevented.

Components of the resist film are prevented from being eluted in the liquid supplied onto the substrate W due to defects of the resist cover film. This prevents an occurrence of processing defects of the substrate W and contamination of the liquid supplied onto the substrate W. Consequently, an exposure lens of the exposure device 15 is prevented from being contaminated by the liquid on the substrate W.

Since the surface condition of the substrate W is inspected in the edge exposure unit EEW, a separate inspection device is not required. This suppresses an increase in the size and manufacturing cost of the substrate processing apparatus 100. Unlike a case where a separate inspection device is provided, the number of the transport processes of the substrate W does not increase. This prevents degradation in the throughput of the substrate processing apparatus 100.

The surface inspection processing is performed simultaneously with the edge sampling processing in the edge exposure unit EEW. Accordingly, an increase in a processing time period in the edge exposure unit EEW is suppressed. This prevents degradation in the throughput of the substrate processing apparatus 100.

In the edge exposure unit EEW, the radius region T1 of the substrate W is irradiated with the illumination light during one rotation of the substrate W, so that the distribution of brightness of the reflected light on the entire surface of the substrate W is obtained. In this case, the illuminator 581, the reflecting mirror 582 and the CCD line sensor 583, which are comparatively small, can be employed. Accordingly, the illuminator 581, the reflecting mirror 582 and the CCD line sensor 583 can be provided even when a space for the edge exposure unit EEW is limited.

(9-2)

In the first and second processing blocks 12, 13, the plurality of substrates W can be concurrently processed in the processing section on the upper stage (the coating processing chambers 21, 22, 32, the development processing chamber 31 (FIG. 2), the upper stage transport chambers 125, 135 (FIG. 5) and the upper thermal processing sections 301, 303 (FIG. 3)) and the processing section on lower stage (the coating processing chambers 23, 24, 34, the development processing chamber 33 (FIG. 2), the lower stage transport chambers 126, 136 (FIG. 5) and the lower thermal processing sections 302, 304 (FIG. 3)) in the present embodiment.

Accordingly, the throughput of the first and second processing blocks 12, 13 can be improved without increasing the transport speed of the substrates W by the transport mechanisms 127, 128, 137, 138. The transport mechanisms 127, 128 are provided one above the other and the transport mechanisms 137, 138 are provided one above the other, thus preventing the increase of footprint of the substrate processing apparatus 100.

(9-3)

The processing section on the upper stage and the processing section on the lower stage in the first and second processing blocks 12, 13 have the equal configurations in the present embodiment. Thus, even when a failure or the like occurs in one of the processing section on the upper stage and the processing section on the lower stage, the processing of the substrates W can be continued in the other processing section. This results in improved flexibility of the substrate processing apparatus 100.

(9-4)

The transport mechanism 141 can transport the substrates W among the placement/buffer sections P-BF1, P-BF2, the cleaning/drying processing section 161 and the cooling platforms P-CP, and the transport mechanism 142 can transport the substrates W among the placement/buffer sections P-BF1, P-BF2, the cleaning/drying processing section 162, the thermal processing section 133 and the cooling platforms P-CP in the cleaning/drying processing block 14A in the present embodiment.

This allows a wider choice of transport paths of the substrates W to be available in the cleaning/drying processing block 14A. Accordingly, the substrates W can be transported through optimum paths depending on how the substrates W are to be processed in the first and second processing blocks 12, 13 and the cleaning/drying processing sections 161, 162. This allows transport efficiency of the substrates W to be increased, resulting in improved throughput.

(9-5)

In the present embodiment, the substrates W before the exposure processing are transported by the transport mechanism 141, and the substrates W after the exposure processing are transported by the transport mechanism 142 in the cleaning/drying processing block 14A. The substrates W before the exposure processing are transported by the hand H7 of the transport mechanism 146, and the substrates W after the exposure processing are transported by the hand H8 of the transport mechanism 146 in the carry-in/carry-out block 14B.

In this manner, respective transport paths are independently ensured for the substrates W before the exposure processing and the substrates W after the exposure processing in the cleaning/drying processing block 14A and the carry-in/carry-out block 14B. In this case, the operations of the transport mechanisms 141, 142, 146 are more simplified than the case of complicated transport paths for the substrates W before the exposure processing and the substrates W after the exposure processing. This allows transport efficiency of the substrates W to be increased, resulting in improved throughput.

(9-6)

In the cleaning/drying processing block 14A, the substrates W before the exposure processing are transported from the placement/buffer sections P-BF1, P-BF2 to the cooling platforms P-CP via the cleaning/drying processing section 161 by the transport mechanism 141, and the substrates W after the exposure processing are transported from the substrate platform PASS9 to the upper thermal processing section 303 or the lower thermal processing section 304 via the cleaning/drying processing section 162 by the transport mechanism 142. The substrates W before the exposure processing are transported from the cooling platform P-CP to the exposure device 15 by the hand H7 of the transport mechanism 146, and the substrates W after the exposure processing are transported from the exposure device 15 to the substrate platform PASS9 by the hand H8 of the transport mechanism 146 in the carry-in/carry-out block 14B.

Thus, the substrates W before the exposure processing and the substrates W after the exposure processing are not brought into indirect contact with one another in the cleaning/drying processing block 14A and the carry-in/carry-out block 14B. This prevents cross-contamination between the substrates W before the exposure processing and the substrates W after the exposure processing.

(9-7)

The respective transport paths are independently provided for the substrates W before the exposure processing and the substrates W after the exposure processing, so that the substrates W after the exposure processing can be smoothly transported to the thermal processing units PHP of the second processing block 13.

Thus, the substrates W can be quickly subjected to the PEB processing after the exposure processing. As a result, a chemical reaction within the resist film can be immediately promoted to allow a desired exposure pattern to be obtained. A time period from the exposure processing to the PEB processing can be made substantially constant when the plurality of substrates W are successively processed. This results in prevention of variation in the accuracy of the exposure pattern.

(9-8)

The transport mechanisms 137, 141, 142 can carry the substrates W in and out of the placement/buffer section P-BF1, and the transport mechanisms 138, 141, 142 can carry the substrates W in and out of the placement/buffer section P-BF2. Accordingly, the substrates W can be stored in the placement/buffer sections P-BF1, P-BF2 at various timings before and after the exposure processing. As a result, timings at which the substrates W are transported by the transport mechanisms 137, 138, 141, 142 can be easily adjusted.

The transport mechanisms 141, 142, 146 can carry the substrates W in and out of the substrate platform PASS9 and the cooling platforms P-CP. In this case, the substrates W can be carried in and out of the placement/buffer sections P-BF1, P-BF2, the substrate platform PASS9 and the cooling platforms P-CP from three directions, so that the transport paths of the substrates W can be easily changed.

(9-9)

In the cleaning/drying processing units SD1, the substrates W before the exposure processing are subjected to the cleaning processing, so that part of components of the resist cover film on the substrates W are eluted to be washed. Therefore, even though the substrates W come in contact with the liquid in the exposure device 15, the components of the resist cover film on the substrates W are hardly eluted in the liquid. In addition, dust or the like adhering to the substrates W before the exposure processing can be removed. As a result, contamination in the exposure device 15 is prevented.

(9-10)

The liquid that has adhered to the substrates W during the cleaning processing is removed by subjecting the substrates W after the cleaning processing to the drying processing in the cleaning/drying processing units SD1, so that dust or the like in the atmosphere is prevented from again adhering to the substrates W after the cleaning processing. As a result, contamination in the exposure device 15 can be reliably prevented.

(9-11)

The substrates W after the exposure processing are subjected to the drying processing in the cleaning/drying processing units SD2, thereby preventing the liquid that has adhered to the substrates W during the exposure processing from dropping in the substrate processing apparatus 100. The substrates W after the exposure processing are subjected to the drying processing to prevent dust or the like in the atmosphere from adhering to the substrates W after the exposure processing. Thus, contamination of the substrates W can be prevented.

The substrates W to which the liquid has adhered can be prevented from being transported in the substrate processing apparatus 100 to inhibit the liquid that has adhered to the substrates W during the exposure processing from affecting the atmosphere in the substrate processing apparatus 100. This causes the temperature and humidity in the substrate processing apparatus 100 to be easily adjusted.

(9-12)

The liquid that has adhered to the substrates W during the exposure processing are prevented from adhering to the transport mechanisms 115, 127, 128, 137, 138, 141, 142. Therefore, the liquid is prevented from adhering to the substrates W before the exposure processing. Thus, dust or the like in the atmosphere is prevented from adhering to the substrates W before the exposure processing, so that contamination of the substrate W is prevented. As a result, degradation in resolution performance at the time of the exposure processing can be prevented and contamination in the exposure device 15 can be prevented.

Components of the resist or components of the resist cover film can be reliably prevented from being eluted in the liquid that remains on the substrates W while the substrates W are transported from the cleaning/drying processing units SD2 to the development processing chambers 31, 33. This prevents deformation of the exposure patterns formed on the resist films. As a result, degradation in accuracy of line width during the development processing can be reliably prevented.

(10) Other Examples of the Operations (10-1)

In the foregoing embodiment, the defective substrates W are placed on the placement/buffer sections P-BF1, P-BF2, taken out of the placement/buffer sections P-BF1, P-BF2 at the timings that are set such that the defective substrate W and the normal substrate W need equal time periods from the time when being taken out of the edge exposure unit EEW to the time when being transported to the substrate platforms PASSE, PASSE, and then returned to the carrier 113.

However, the defective substrates W may be returned to the carrier 113 at other timings. For example, the defective substrates W placed on the placement/buffer sections P-BF1, P-BF2 may be sequentially returned to the carrier 113 after the normal substrates W are sequentially returned to the carrier 113, the processing of the substrates W in one lot is finished, and all the normal substrates W are returned to the carrier 113.

After the processing of the substrates W in one lot is finished, the defective substrates W placed on the placement/buffer sections P-BF1, P-BF2 may be collected by the user.

(10-2)

While the processing of the substrates W in each processing section is continuously performed even when the defective substrates W are found in the edge exposure unit EEW in the foregoing embodiment, the present invention is not limited to this.

Operational troubles of the coating processing unit 129, the thermal processing unit PHP, the adhesion reinforcing processing unit PAHP, the cooling unit CP or the like may result in an occurrence of the defective substrates W. Therefore, when the defective substrates W are found in the edge exposure unit EEW of one of the processing section on the upper stage and the processing section on the lower stage in the first and second processing blocks 12, 13, the operation of the processing section may be stopped, and the processing of the substrates W may be continued in the other processing section. In this case, the processing section in which the defective substrates W have been found can be subjected to maintenance while the processing of the substrates W is continued in the other processing section.

(10-3)

While the resist cover films are formed on the substrates W by the coating processing units 129 in the coating processing chambers 32, 34 in the foregoing embodiment, the resist cover film may not be formed in the coating processing chambers 32, 34 when water-resistant resist films are formed in the coating processing chambers 21, 23.

In the case, the condition of the resist film is inspected as the surface condition of the substrate W in the edge exposure unit EEW.

When the resist cover film is not formed on the substrate W, the coating processing chambers 32, 34 may not be provided. Alternatively, another processing such as resist film formation or development processing may be performed in the coating processing chambers 32, 34.

(10-4)

While the substrates W are not subjected to the edge exposure processing when determined not to be normal in the surface condition in the edge exposure unit EEW and further determined by the user that the subsequent processing should not be executed in the foregoing embodiment, the present invention is not limited to this. Such substrates W may be subjected to the edge exposure processing. In the case, the foregoing rejection processing is performed to the substrates W after the edge exposure processing.

(11) Other Embodiments (11-1)

While the edge exposure unit EEW is provided in the second processing block 13 in the foregoing embodiment, the edge exposure unit EEW may be provided in the interface block 14.

Figure 14:
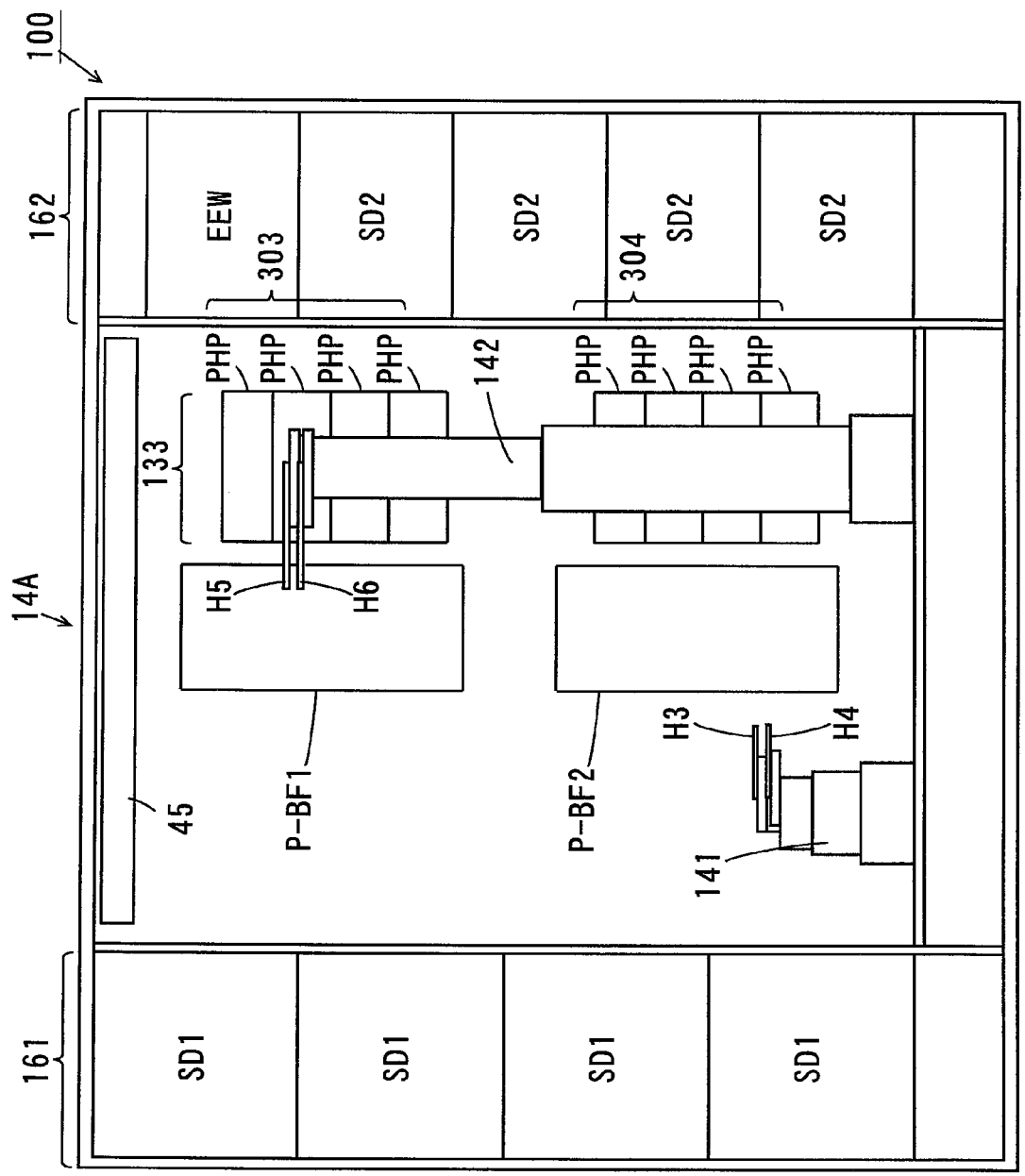
FIG. 14 is a schematic side view showing another example of an interface block.

FIG. 14 is a schematic side view showing another example of the interface block 14. FIG. 14 is a diagram of the cleaning/drying processing block 14A in the interface block 14 that is seen from the side in the +X direction.

In the example of FIG. 14, the edge exposure unit EEW is provided on the uppermost stage of the cleaning/drying processing section 162. Also in this case, the substrates W determined not to be normal in the surface condition in the edge exposure unit EEW are transported to the placement/buffer section P-BF1, and not subjected to the following processing.

This prevents the possibility that the liquid supplied onto the substrate W is not held on the substrate W and flows to the outside of the substrate W in the exposure device 15. Accordingly, an electrical system and so on of the exposure device 15 is prevented from being damaged by the outward flow of the liquid, and change in the temperature within the exposure device 15 to be caused by the outward flow of the liquid is prevented.

Components of the resist film are prevented from being eluted in the liquid supplied onto the substrate W due to defects of the resist cover film. This prevents an occurrence of processing defects of the substrate W, contamination of the liquid supplied onto the substrate W and contamination of the exposure lens of the exposure device 15.

(11-2)

While the exposure device 15 that subjects the substrates W to the exposure processing using the liquid immersion method is used as an external device of the substrate processing apparatus 100 in the foregoing embodiments, the present invention is not limited to this. An exposure device that subjects the substrates W to exposure treatment without using a liquid may be used as the external device of the substrate processing apparatus 100.

In this case, the substrates W determined not to be normal in the surface condition in the edge exposure unit EEW are not carried into the exposure device 15, and distinguished from the substrates W that are normal in the surface condition to be collected.

The exposure processing is not properly performed and processing defects are liable to occur in the substrates W that are not normal in the surface condition. Therefore, the collecting operation is easier when the substrates W that are not normal in the surface condition are distinguished from the substrates W that are normal in the surface condition to be collected than when the substrates W in which the processing defects have occurred are detected to be collected after the exposure processing.

In the exposure device 15 and the substrate processing apparatus 100, the substrates W in which the processing defects are liable to occur are prevented from being subjected to unnecessary processing.

(12) Correspondences Between Elements in the Claims and Parts in Embodiments In the following paragraphs, non-limiting examples of correspondences between various elements recited in the claims below and those described above with respect to various preferred embodiments of the present invention are explained.

In the foregoing embodiments, the coating processing unit 129 is an example of a film formation unit, the development processing unit 139 is an example of a development unit, the edge exposure unit EEW is an example of an inspection/periphery exposure unit and an inspection/periphery exposure apparatus, the transport mechanisms 115, 127, 128, 137, 138, 141, 142, 146 are examples of a transport device, the controller 114 is an example of a controller, the placement/buffer sections P-BF1, P-BF2 are example of a storage, and the carrier platform 111 is an example of a container platform.

The first and second processing blocks 12, 13 are examples of a processing section, the interface block 14 is an example of an interface, the transport mechanisms 127, 128, 137, 138 are examples of a transport mechanism for a processing section, and the transport mechanisms 141, 142, 146 are examples of a transport mechanism for the interface.

The coating processing chambers 21, 22, 32, the development processing chamber 31, the upper stage transport chambers 125, 135 and the upper thermal processing sections 301, 303 are examples of a first level section, the coating processing chambers 23, 24, 34, the development processing chamber 33, the lower stage transport chambers 126, 136 and the lower thermal processing sections 302, 304 are examples of a second level section, the coating processing unit 129 of the coating processing chamber 21 is an example of a first film formation unit, the coating processing unit 129 of the coating processing chamber 23 is an example of a second film formation unit, the development processing unit 139 of the development processing chamber 31 is an example of a first development unit, the development processing unit 139 of the development processing chamber 33 is an example of a second development unit, the edge exposure unit EEW of the upper thermal processing section 303 is an example of a first inspection/periphery exposure unit, the edge exposure unit EEW of the lower thermal processing section 304 is an example of a second inspection/periphery exposure unit, the transport mechanisms 127, 137 are examples of a first transport mechanism, and the transport mechanisms 128, 138 are examples of a second transport mechanism.

The substrate rotating unit 540 is an example of a substrate holding/rotating device, the outer edge detecting unit 550 is an example of an outer edge detector, the surface inspection processing unit 580 is an example of a surface condition detector, and the projector 510 is an example of a light irradiator for exposure.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate processing apparatus that is disposed adjacent to an exposure device that subjects a substrate to exposure processing, comprising:
   a film formation unit arranged to form a photosensitive film on the substrate before the exposure processing by said exposure device;
   a development unit arranged to subject the photosensitive film on the substrate to development processing after the exposure processing by said exposure device;
   an inspection/periphery exposure unit arranged to inspect a surface condition of the substrate and subject a peripheral portion of the photosensitive film on the substrate to exposure processing after the photosensitive film is formed by said film formation unit and before the exposure processing is performed by said exposure device; and
   a transport device arranged to transport the substrate among said film formation unit, said development unit, said inspection/periphery exposure unit and said exposure device, wherein said inspection/periphery exposure unit includes:
   a substrate holding/rotating device arranged to rotate the substrate while holding the substrate;
   a surface condition detector arranged to detect the surface condition of the substrate rotated by said substrate holding/rotating device; and
   a light irradiator for exposure arranged to irradiate a portion of the photosensitive film formed on a peripheral portion of the substrate rotated by said substrate holding/rotating device with light for exposure, to perform edge exposure processing.

2. The substrate processing apparatus according to claim 1, further comprising a controller arranged to determine whether or not the surface condition of the substrate is normal based on a result of inspection of the surface condition of the substrate in said inspection/periphery exposure unit, and control said transport device to transport the substrate determined to be normal to said exposure device and control said transport device not to transport the substrate determined not to be normal to said exposure device.

3. The substrate processing apparatus according to claim 2, further comprising a storage arranged to store the substrate determined not to be normal by said controller.

4. The substrate processing apparatus according to claim 3, further comprising a container platform on which a storing container is placed, wherein said controller is arranged to control said transport device to sequentially take substrates out of said storing container, and control said transport device to cause the substrates that have been subjected to the exposure processing by said exposure device and the development processing by said development unit and the substrates stored in said storage to be stored in said storing container in the same order as that in which the substrates have been taken out from said storing container.

5. The substrate processing apparatus according to claim 1, further comprising:

a processing section; and an interface that is disposed between said processing section and said exposure device and is arranged to carry the substrate in and out of said exposure device, wherein said film formation unit and said development unit are provided in said processing section, said inspection/periphery exposure unit is provided in at least one of said processing section and said interface, and said transport device includes a transport mechanism for the processing section arranged to transport the substrate in said processing section, and a transport mechanism for the interface arranged to transport the substrate in said interface.

6. The substrate processing apparatus according to claim 5, wherein said processing section includes a first level section and a second level section, said film formation unit includes a first film formation unit provided in said first level section and a second film formation unit provided in said second level section, said development unit includes a first development unit provided in said first level section and a second development unit provided in said second level section, said inspection/periphery exposure unit includes a first inspection/periphery exposure unit provided in said first level section and a second inspection/periphery exposure unit provided in said second level section, said transport mechanism for the processing section includes a first transport mechanism that is provided in said first level section and transports the substrate in said first level section, and a second transport mechanism that is provided in said second level section and transports the substrate in said second level section.

7. The substrate processing apparatus according to claim 6, wherein said controller is arranged to determine whether or not the surface condition of the substrate is normal based on a result of inspection of the surface condition of the substrate in said first inspection/periphery exposure unit, control said first transport mechanism to transport the substrate determined to be normal to said interface, and control said first transport mechanism not to transport the substrate determined not to be normal to said interface, and determine whether or not the surface condition of the substrate is normal based on a result of inspection of the surface condition of the substrate in said second inspection/periphery exposure unit, control said second transport mechanism to transport the substrate determined to be normal to said interface, and control said second transport mechanism not to transport the substrate determined not to be normal to said interface.

8. The substrate processing apparatus according to claim 1, wherein said inspection/periphery exposure unit further includes an outer edge detector arranged to detect a position of an outer edge of the substrate rotated by said substrate holding/rotating device.

9. The substrate processing apparatus according to claim 8, wherein said surface condition detector is configured to detect the surface condition of the substrate when the position of the outer edge is detected by said outer edge detector.

10. A substrate processing system comprising:

one or a plurality of substrate processing apparatuses that are each disposed adjacent to an exposure device that subjects a substrate to exposure processing; and a host computer connected to said one or plurality of substrate processing apparatuses, wherein each substrate processing apparatus includes:

a film formation unit arranged to form a photosensitive film on the substrate before the exposure processing by said exposure device;

a development unit arranged to subject the photosensitive film on the substrate to development processing after the exposure processing by said exposure device;

an inspection/periphery exposure unit arranged to inspect a surface condition of the substrate and subject a peripheral portion of the photosensitive film on the substrate to exposure processing after the photosensitive film is formed by said film formation unit and before the exposure processing is performed by said exposure device; and a transport device arranged to transport the substrate among said film formation unit, said development unit, said inspection/periphery exposure unit and said exposure device, and said substrate processing system is configured to transmit a result of inspection in said inspection/periphery exposure unit in each of said one or plurality of substrate processing apparatuses to said host computer, wherein said inspection/periphery exposure unit includes:

a substrate holding/rotating device arranged to rotate the substrate while holding substrate;

a surface condition detector arranged to detect the surface condition of the substrate rotated by said substrate holding/rotating device; and a light irradiator for exposure arranged to irradiate a portion of the photosensitive film formed on a peripheral portion of the substrate rotated by said substrate holding/rotating device with light for exposure, to perform edge exposure processing.

* * * * *